(12) United States Patent
Lee et al.

(10) Patent No.: US 12,554,191 B2
(45) Date of Patent: Feb. 17, 2026

(54) PELLICLE MEMBRANE AND METHOD OF FORMING THE SAME

(71) Applicant: TAIWAN SEMICONDUCTOR MANUFACTURING COMPANY, LTD., Hsinchu (TW)

(72) Inventors: Wei-Hao Lee, Taipei (TW); Pei-Cheng Hsu, Taipei (TW); Huan-Ling Lee, Hsinchu County (TW); Hsin-Chang Lee, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 796 days.

(21) Appl. No.: 17/843,723

(22) Filed: Jun. 17, 2022

(65) Prior Publication Data

US 2023/0408904 A1    Dec. 21, 2023

(51) Int. Cl.
*G03F 1/62* (2012.01)
*C23C 16/26* (2006.01)
*C23C 16/455* (2006.01)

(52) U.S. Cl.
CPC ............... *G03F 1/62* (2013.01); *C23C 16/26* (2013.01); *C23C 16/45536* (2013.01)

(58) Field of Classification Search
CPC ................ G03F 1/63; G03F 1/64; G03F 1/62
See application file for complete search history.

(56) References Cited

U.S. PATENT DOCUMENTS

| 8,764,995 B2 | 7/2014 | Chang et al. |
| 8,796,666 B1 | 8/2014 | Huang et al. |
| 8,828,625 B2 | 9/2014 | Lu et al. |

(Continued)

FOREIGN PATENT DOCUMENTS

| CN | 102352490 A | * | 2/2012 | |
| CN | 104517892 A | * | 4/2015 | ........... C23C 16/045 |

(Continued)

OTHER PUBLICATIONS

Ji et al., "A brief review of plasma enhanced atomic layer deposition of Si3N4", Appl. Sci. Converg. Technol. vol. 28(5) pp. 142-147 (2019).*

(Continued)

*Primary Examiner* — Martin J Angebranndt
(74) *Attorney, Agent, or Firm* — Birch, Stewart, Kolasch & Birch, LLP

(57) ABSTRACT

A method of forming a pellicle includes forming a protective film surrounding a membrane to form a pellicle membrane using a plasma enhanced atomic layer deposition (PEALD) process, in which the membrane includes a network of carbon nanotubes, the PEALD process is performed by a plurality of cycles, and each of the cycles includes igniting a plasma in a deposition chamber, after igniting the plasma, introducing a silicon-based precursor into the deposition chamber, purging the silicon-based precursor, introducing a reactant gas into the deposition chamber, and purging the reactant gas, placing the pellicle membrane on a filter membrane, transferring the pellicle membrane from the filter membrane to a pellicle border, attaching the pellicle border to a pellicle frame, and mounting the pellicle frame onto a photomask comprising a pattern region.

20 Claims, 14 Drawing Sheets

(56) References Cited

U.S. PATENT DOCUMENTS

| | | |
|---|---|---|
| 8,841,047 B2 | 9/2014 | Yu et al. |
| 8,877,409 B2 | 11/2014 | Hsu et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 2020/0201169 A1* | 6/2020 | Mariano Juste ........... G03F 1/62 |
| 2021/0191255 A1* | 6/2021 | Timmermans ...... G03F 7/70983 |
| 2022/0260932 A1* | 8/2022 | Hsu .................... G03F 7/70958 |

FOREIGN PATENT DOCUMENTS

| | | | | |
|---|---|---|---|---|
| EP | 4202546 A1 * | 6/2023 | ............... | G03F 1/62 |
| WO | WO-2020093013 A1 * | 5/2020 | ........... | C23C 16/402 |
| WO | WO-2022010214 A1 * | 1/2022 | ......... | C23C 16/4408 |
| WO | WO-2023117853 A1 * | 6/2023 | ............... | G03F 1/62 |

OTHER PUBLICATIONS

Cheng et al. "Platinum single-atom and cluster catalysis of the hydrogen evolution reaction", Nature Commun., vol. 7 Article 13638 (9 pages) (2016) (Year: 2016).*

Van Drunen, "Atomic layer deposition of silicon nitride from novel precursor DSBAS and nitrogen plasma", Eindhoven University of Technology Thesis (2015) (118 pages) (Year: 2015).*

* cited by examiner

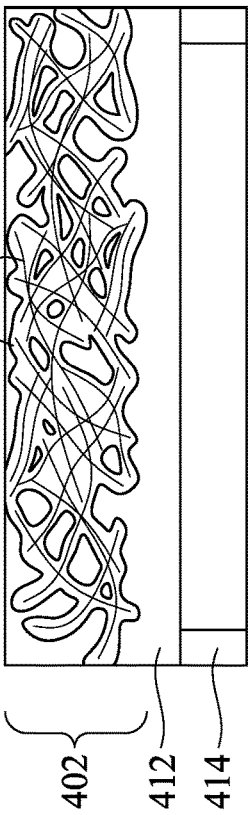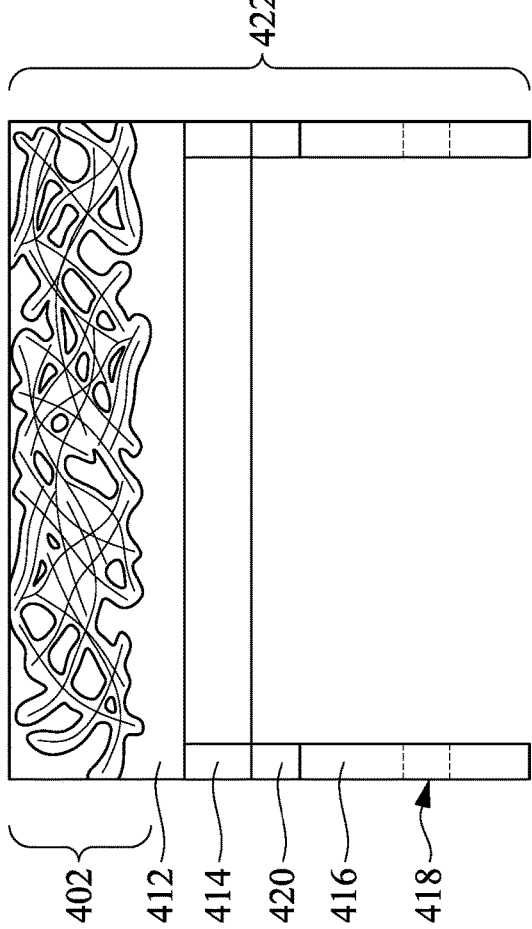

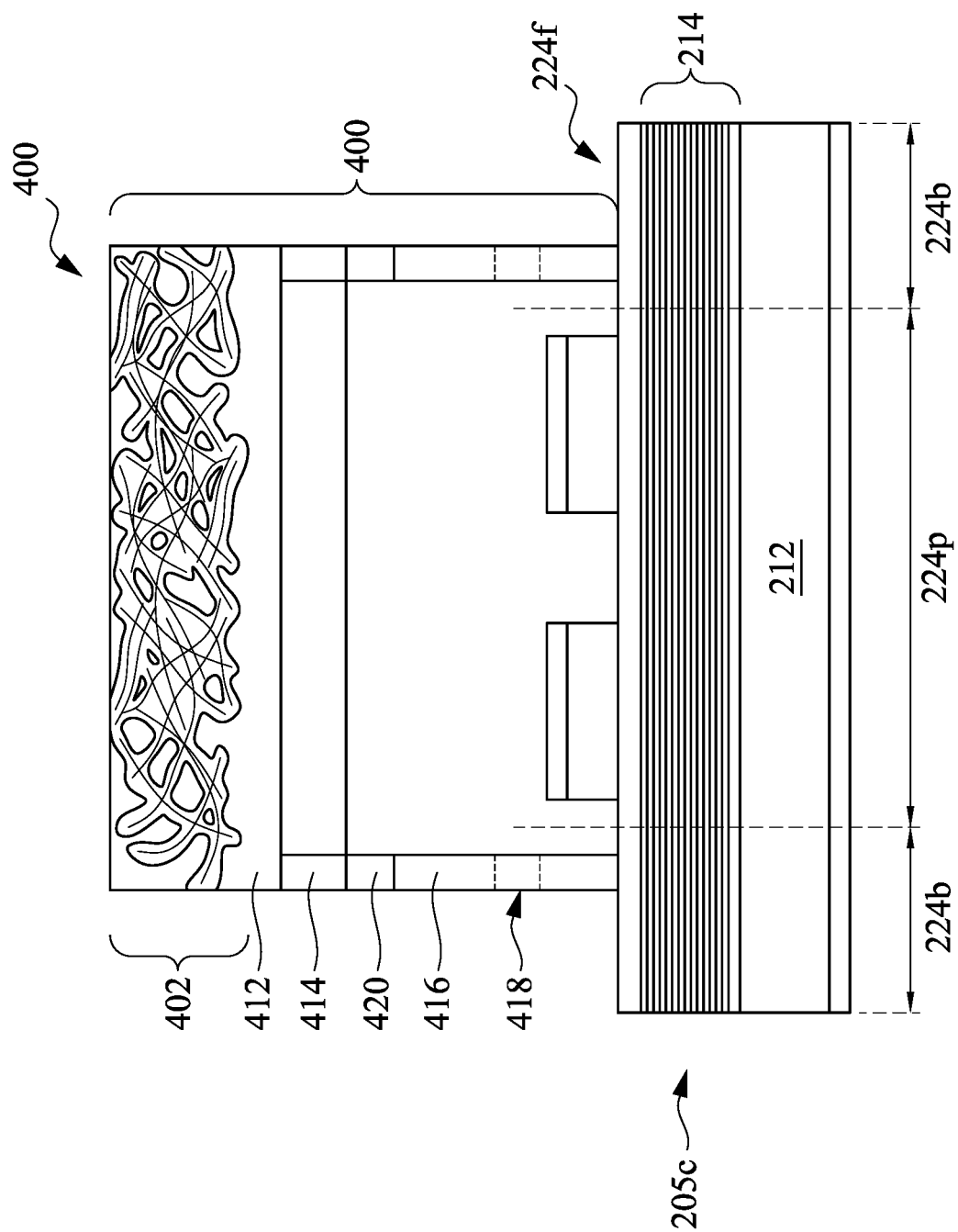

PELLICLE MEMBRANE AND METHOD OF FORMING THE SAME

BACKGROUND

Semiconductor devices are used in a variety of electronic applications, such as personal computers, cell phones, digital cameras, and other electronic equipment. Semiconductor devices are typically fabricated by subsequently depositing insulating or dielectric layers, conductive layers, and semiconductor layers of material over a semiconductor substrate, and patterning the various material layers using lithography to form circuit components and elements thereon.

One important driver for increasing performance in a semiconductor device is the higher levels of integration of circuits. This is accomplished by miniaturizing or shrinking device sizes on a given chip. Extreme ultraviolet (EUV) lithography technology has been developed in order to transfer finer patterns onto wafers. The EUV lithograph technology is considered a next-generation technology which will be used to fabricate a slimmer and faster microchip.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8, 9, 10, and 11 are cross-sectional views of various stages of forming a pellicle assembly, in accordance with some embodiments.

FIG. 12 is a cross-sectional view of a pellicle assembly attached to an EUV reticle, in accordance with some embodiments.

DETAILED DESCRIPTION

Figure 1A:
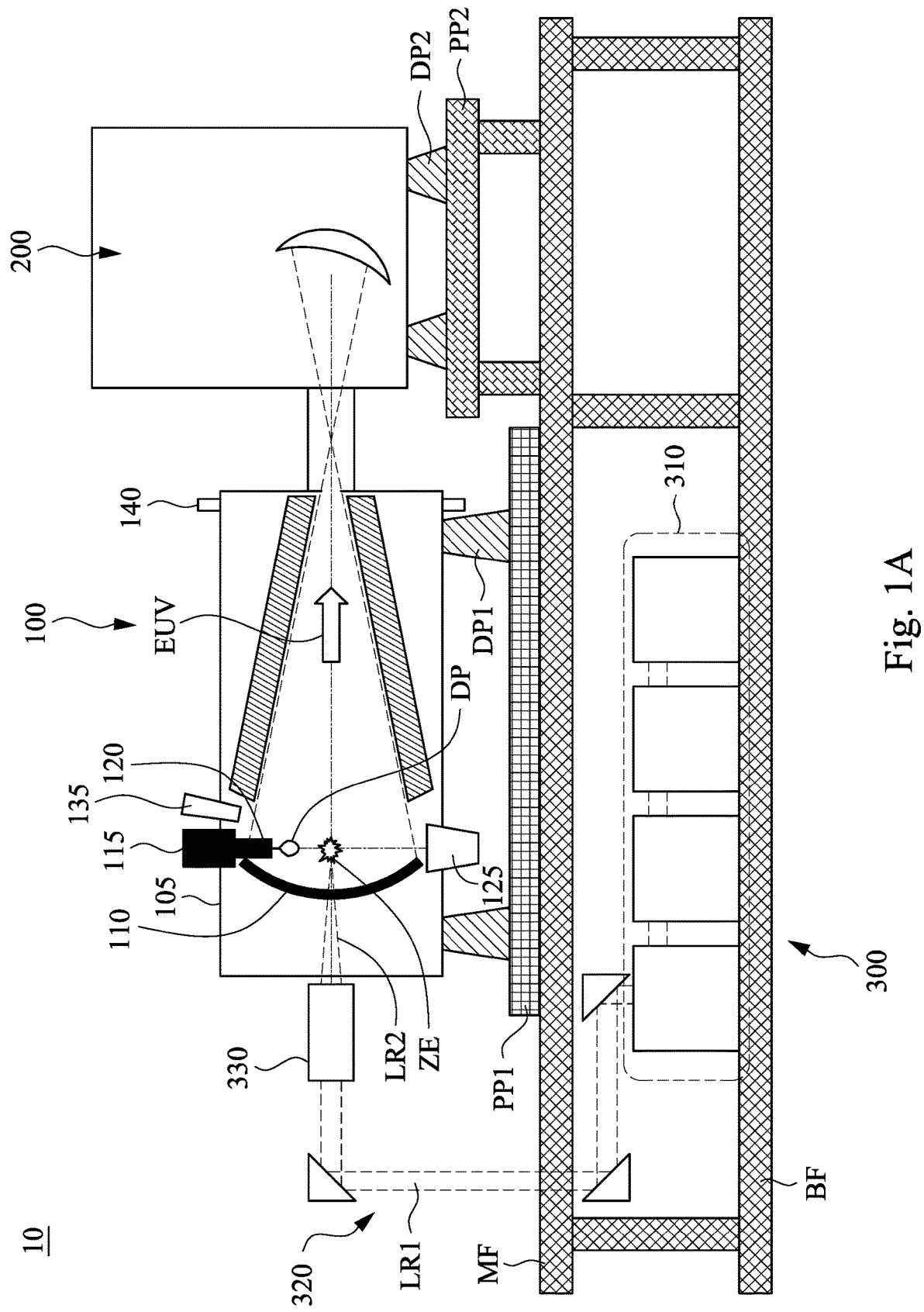
FIG. 1A is a schematic view of an EUV lithography tool with an LPP-based EUV radiation source, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In semiconductor fabrication, various lithographic processes are extensively used in the course of defining devices and circuit patterns. Depending on the size of the features to be defined, different optical lithographic processes may be used. In a lithographic process, a pattern present on a photomask or reticle may be transferred to a light-sensitive photoresist coating by illuminating the photomask. The light is modulated by the reticle pattern and imaged onto a photoresist-coated wafer. In general, as the patterns become smaller, shorter wavelength are utilized. In extreme ultraviolet (EUV) lithography, a wavelength of about 13.5 nm is frequently used to produce feature sizes of less than 32 nanometers.

A pellicle including a pellicle membrane is commonly placed above the patterned side of the photomask with a gap to protect the photomask from contamination during handling and exposure. The pellicle thus protects the photomask from unwanted particles which otherwise could negatively impact the fidelity of the pattern transfer to the wafer. As the pellicle membrane remains covering the photomask during exposure, there are stringent requirements for the pellicle membrane in terms of absorption, durability, and particle shielding capability, etc.

When it comes to EUV lithography, it has been challenging to find suitable pellicle membrane materials that have high transmission and stability at EUV wavelengths. Carbon nanotube (CNT) pellicle membrane proved to be a promising option with high EUV transmission, low reflectivity, and good mechanical stability. The lifetime of the CNT pellicle membrane can be limited by the exposure to hydrogen radicals/ions generated by EUV radiation inside the scanner.

Embodiments of the present disclosure provide a CNT pellicle membrane covered by a protective film to protect the CNT material from hydrogen radicals/ions that are present in the scanner during exposure, and hence prolonging the CNT pellicle membrane lifetime. The protection film can be deposited on the CNT material by atomic layer deposition (ALD), such as a plasma enhanced atomic layer deposition (PEALD). As compared with physical vapor deposition (PVD) and chemical vapor deposition (CVD), ALD is beneficial for depositing conformal and continuous films at low growth temperature with precise thickness control and lower thermal budget. The various aspects of the present disclosure will be discussed below in greater detail with reference to FIGS. 1A-13E. First, a EUV lithography system will be discussed below with reference to FIGS. 1A, 1B and 2. Next, the details of the formation of a novel pellicle assembly with be discussed with reference to FIGS. 3-11. FIG. 12 is a cross-sectional view of a pellicle assembly attached to an EUV reticle, in accordance with some embodiments. Next, the details of the novel photoresist and the lithography process employing the photoresist will be discussed with reference to FIGS. 13A-13E.

FIG. 1A is a schematic view diagram of a EUV lithography system 10, constructed in accordance with some embodiments. The EUV lithography system 10 may also be generically referred to as a scanner that is configured to perform lithography exposure processes with respective radiation source and exposure mode. The EUV lithography system 10 is designed to expose a photoresist layer by EUV light or EUV radiation. The photoresist layer is a material sensitive to the EUV light. The EUV lithography system 10 employs a radiation source 100 to generate EUV light, such as EUV light having a wavelength ranging at about 13.5 nm. Accordingly, the radiation source 100 is also referred to as EUV radiation source 100.

The advanced lithography process, method, and materials described in the current disclosure can be used in many applications, including fin-type field effect transistors (Fin-FETs), gate-all-around (GAA) FETs. For example, the fins may be patterned to produce a relatively close spacing between features, for which the above disclosure is well suited. In addition, spacers used in forming fins of FinFETs can be processed according to the above disclosure.

The EUV lithography system 10 is an EUV lithography tool with an LPP-based EUV radiation source, in accordance with some embodiments of the present disclosure. The EUV lithography system includes an EUV radiation source 100 to generate EUV radiation, an exposure device 200, such as a scanner, and an excitation laser source 300. As shown in FIG. 1A, in some embodiments, the EUV radiation source 100 and the exposure device 200 are installed on a main floor MF of a clean room, while the excitation laser source 300 is installed in a base floor BF located under the main floor MF. Each of the EUV radiation source 100 and the exposure device 200 are placed over pedestal plates PP1 and PP2 via dampers DP1 and DP2, respectively. The EUV radiation source 100 and the exposure device 200 are coupled to each other by a coupling mechanism, which may include a focusing unit.

The EUV lithography tool is designed to expose a resist layer to EUV light (also interchangeably referred to herein as EUV radiation). The resist layer is a material sensitive to the EUV light. The EUV lithography system employs the EUV radiation source 100 to generate EUV light, such as EUV light having a wavelength at about 13.5 nm. In the present embodiment, the EUV radiation source 100 utilizes a mechanism of laser-produced plasma (LPP) to generate the EUV radiation.

The exposure device 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask.

Figure 1B:
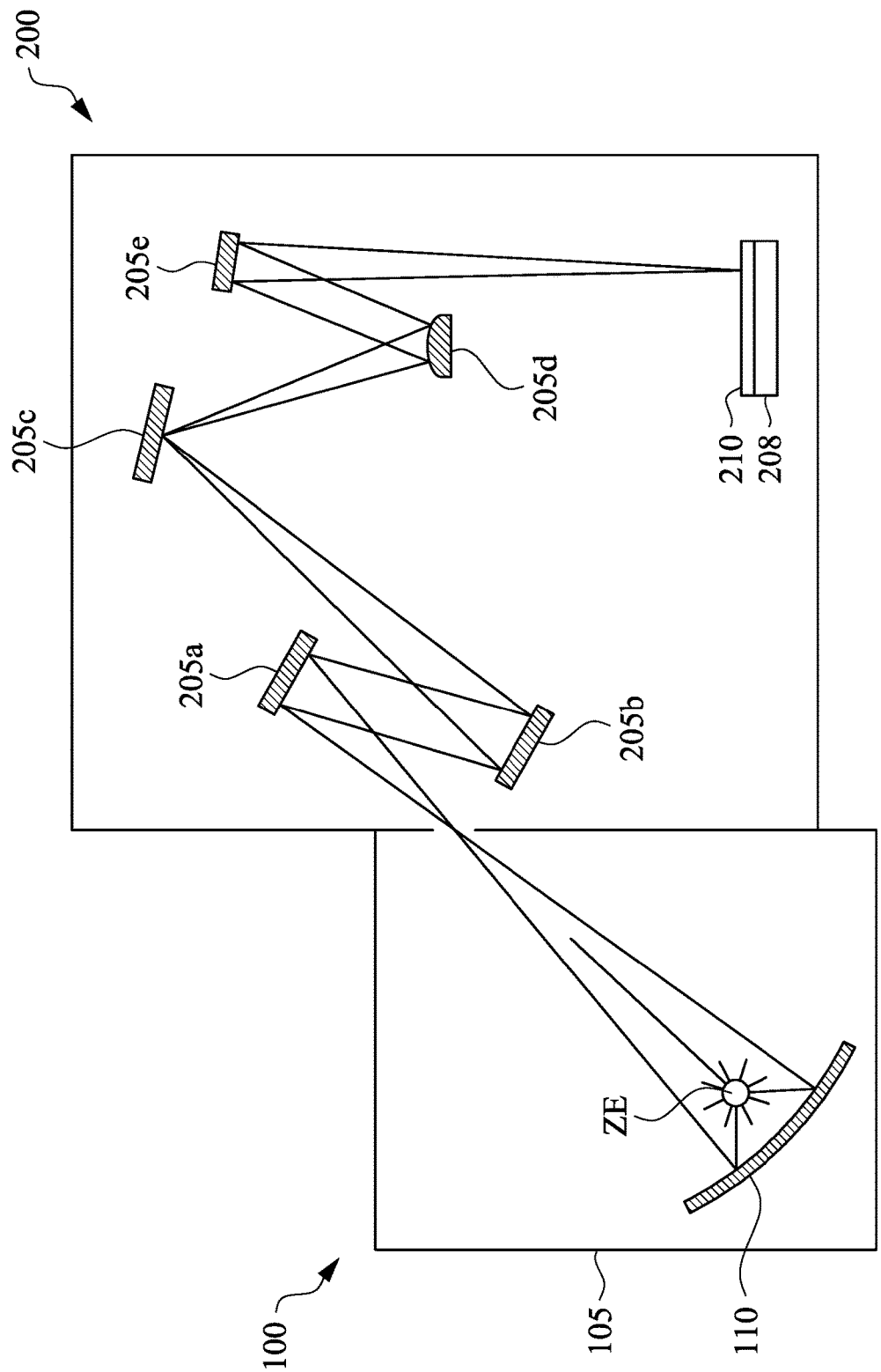
FIG. 1B is a simplified schematic diagram of a detail of an extreme ultraviolet lithography tool according to an embodiment of the disclosure showing the exposure of photoresist coated substrate with a patterned beam of EUV light.

FIG. 1B is a simplified schematic diagram of a detail of an extreme ultraviolet lithography tool according to an embodiment of the disclosure showing the exposure of photoresist coated substrate 210 secured on a substrate stage 208 of the exposure device 200 with a patterned beam of EUV light. The exposure device 200 is an integrated circuit lithography tool such as a stepper, scanner, step and scan system, direct write system, device using a contact and/or proximity mask, etc., provided with one or more optics 205a, 205b, for example, to illuminate a photomask 205c, such as a reticle, with a beam of EUV light, to produce a patterned beam, and one or more reduction projection optics 205d, 205e, for projecting the patterned beam onto the photoresist coated substrate 210. A mechanical assembly (not shown) may be provided for generating a controlled relative movement between the photoresist coated substrate 210 and the photomask 205c. As further shown in FIG. 1A, the EUVL tool includes an EUV radiation source 100 including an EUV light radiator ZE emitting EUV light in a chamber 105 that is reflected by a collector 110 along a path into the exposure device 200 to irradiate the photoresist coated substrate 210.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gradings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic", as used herein, is directed to, but not limited to, components which operate solely or to advantage within one or more specific wavelength range(s) such as at the EUV output light wavelength, the irradiation laser wavelength, a wavelength suitable for metrology or any other specific wavelength.

In various embodiments of the present disclosure, the photoresist coated substrate 210 is a semiconductor wafer, such as a silicon wafer or other type of wafer to be patterned. The EUVL tool further includes other modules or is integrated with (or coupled with) other modules in some embodiments.

As shown in FIG. 1A, the EUV radiation source 100 includes a target droplet generator 115 and a collector 110, enclosed by a chamber 105. For example, the collector 110 is a laser-produced plasma (LPP) collector. In various embodiments, the target droplet generator 115 includes a reservoir to hold a source material and a nozzle 120 through which target droplets DP of the source material are supplied into the chamber 105.

In some embodiments, the target droplets DP are metal droplets of tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, having a diameter of about 10 μm to about 100 μm. In other embodiments, the target droplets DP are tin droplets having a diameter of about 25 μm to about 50 μm. In some embodiments, the target droplets DP are supplied through the nozzle 120 at a rate in a range from about 50 droplets per second (i.e., an ejection-frequency of about 50 Hz) to about 50,000 droplets per second (i.e., an ejection-frequency of about 50 kHz).

An excitation laser LR2 generated by the excitation laser source 300 is a pulse laser. The laser pulses LR2 are generated by the excitation laser source 300. The excitation laser source 300 may include a laser generator 310, laser guide optics 320 and a focusing apparatus 330. In some embodiments, the laser generator 310 includes a carbon dioxide ($CO_2$) or a neodymium-doped yttrium aluminum garnet (Nd:YAG) laser source with a wavelength in the infrared region of the electromagnetic spectrum. For example, the laser generator 310 has a wavelength of about 9.4 μm or about 10.6 μm, in an embodiment. The laser light LR1 generated by the laser generator 310 is guided by the laser guide optics 320 and focused into the excitation laser LR2 by the focusing apparatus 330, and then introduced into the EUV radiation source 100.

In some embodiments, the excitation laser LR2 includes a pre-heat laser and a main laser. In such embodiments, the pre-heat laser pulse (interchangeably referred to herein as the "pre-pulse") is used to heat (or pre-heat) a given target droplet to create a low-density target plume with multiple smaller droplets, which is subsequently heated (or reheated) by a pulse from the main laser, generating increased emission of EUV light.

In various embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser LR2 is matched with (e.g., synchronized with) the ejection-frequency of the target droplets DP in an embodiment.

The excitation laser LR2 is directed through windows (or lenses) into the zone of excitation ZE in front of the collector 110. The windows are made of a suitable material substantially transparent to the laser beams. The generation of the pulse lasers is synchronized with the ejection of the target droplets DP through the nozzle 120. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation EUV, which is collected by the collector 110. The collector 110 further reflects and focuses the EUV radiation for the lithography exposing processes performed through the exposure device 200. The droplet catcher 125 is used for catching excessive target droplets. For example, some target droplets may be purposely missed by the laser pulses.

In some embodiments, the collector 110 is designed with a proper coating material and shape to function as a mirror for EUV collection, reflection, and focusing. In some embodiments, the collector 110 is designed to have an ellipsoidal geometry. In some embodiments, the coating material of the collector 110 is similar to the reflective multilayer of the EUV mask. In some examples, the coating material of the collector 110 includes a ML (such as a plurality of Mo/Si film pairs) and may further include a capping layer (such as Ru) coated on the ML to substantially reflect the EUV light. In some embodiments, the collector 110 may further include a grating structure designed to effectively scatter the laser beam directed onto the collector 110. For example, a silicon nitride layer is coated on the collector 110 and is patterned to have a grating pattern.

Figure 2:
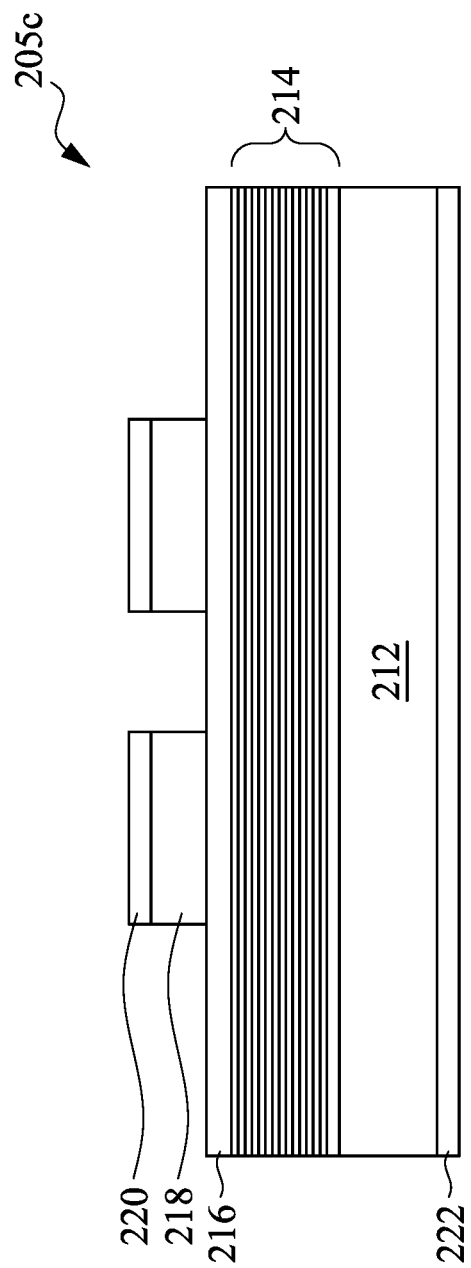
FIG. 2 is a sectional view of a EUV mask constructed in accordance with some embodiments of the present disclosure.

In the present disclosure, the terms mask, photomask, and reticle are used interchangeably. In the present embodiment, the photomask 205c is a reflective mask. FIG. 2 illustrates an exemplary photomask 205c in accordance with some embodiments. As shown in FIG. 2, in some embodiments, the photomask 205c may include a substrate 212 having a backside coating layer 222, a multi-layer (ML) structure 214, a capping layer 216, and one or more absorbers 218 having an anti-reflective coating (ARC) layer 220.

In some embodiments, the substrate 212 includes a low thermal expansion (LTE) glass, fused quartz, silicon carbide, carbonado or another appropriate material.

In some embodiments, the backside coating layer 222 includes a chromium nitride ($Cr_xN_y$), tantalum nitride (TaN), or tantalum boride (TaB). The backside coating layer 222 helps to ensure reflection of incident radiation.

The ML structure 214 is disposed over the substrate 212. The ML structure 34 may be selected such that it provides a high reflectivity to a selected radiation type/wavelength. The ML structure 214 includes a plurality of film pairs, such as Mo/Si film pairs (e.g., a layer of molybdenum above or below a layer of silicon in each film pair). Alternatively, the ML structure 214 may include Mo/Be film pairs, or any materials with refractive index difference being highly reflective at EUV wavelengths.

Still referring to FIG. 2, the photomask 205c also includes a capping layer 216 disposed over the ML structure 214 to prevent oxidation of the ML structure 214. In some embodiments, the capping layer 216 includes a ruthenium (Ru) capping layer. The capping layer 216 may also serve as an etch-stop layer for a subsequent absorber layer etch process.

In some embodiments, the absorbers 218 are configured to absorb EUV light (e.g., with a wavelength of about 13.5 nm). In some embodiments, the absorbers 218 may include for example, a TaxNy layer or a TaxByOzNu layer. In some examples, other materials may be used for the absorbers 218, such as Al, Cr, Ta, and W, or the like.

In some examples, the ARC layer 220 includes at least one of a TaxByOzNu layer, a HfxOy layer, or a SixOyNz layer or other suitable anti-reflective materials for the wavelength of the incident radiation.

While some examples of materials that may be used for each of the substrate 212, the backside coating layer 222, the multi-layer structure 214, the capping layer 216, the absorbers 218, and the ARC layer 220 have been given, it will be understood that other suitable materials as known in the art may be equally used without departing from the scope of the present disclosure.

Figure 3:
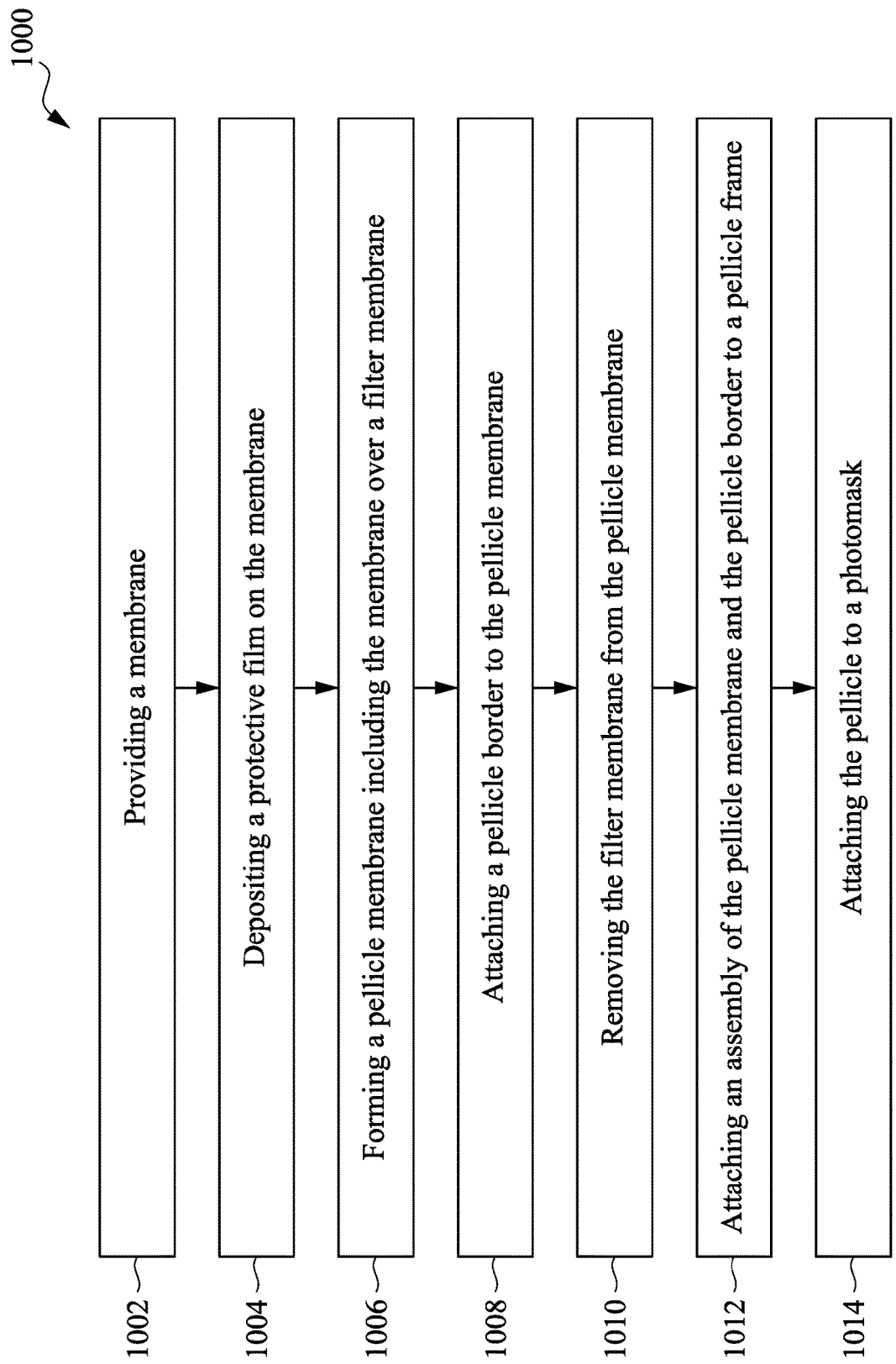
FIG. 3 is a flowchart of a method of fabricating a pellicle assembly, in accordance with some embodiments.

FIG. 3 is a flowchart of a method 1000 for fabricating a mask pellicle structure, in accordance with some embodiments of the present disclosure. It is understood that additional steps can be provided before, during, and after the method 1000, and some of the steps described below can be replaced or eliminated, for additional embodiments of the method. It is further understood that additional features can be added in the pellicle-mask structure, and some of the features described below can be replaced or eliminated, for additional embodiments of the semiconductor structure.

Figure 4:
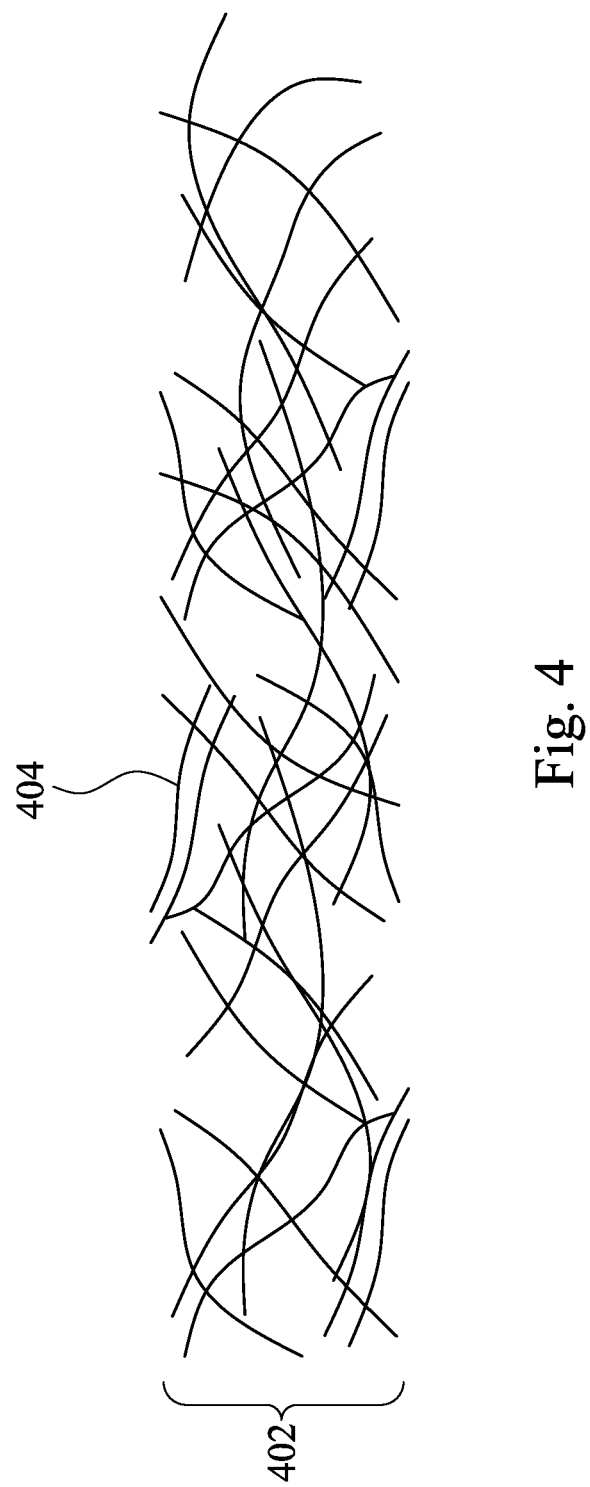
FIGS. 4 and 5A are cross-sectional views of various stages of forming a pellicle assembly, in accordance with some embodiments.

FIG. 4 is a cross-sectional view of various stages of forming pellicle assembly, in accordance with some embodiments. Referring to FIG. 3 and FIG. 4, the method 1000 includes operation 1002, in which a membrane is provided in accordance with some embodiments. For example, a membrane 402 including a network of carbon nanotubes (CNT) 404 is provided. The membrane 402 can be a grown CNT film or a flocculated CNT film. For example, a flocculated CNT film is prepared by providing a plurality of CNT used as raw material by processes including forming a catalyst layer on a substrate, annealing the catalyst layer made of iron (Fe), cobalt (Co), nickel (Ni), and an alloy thereof at high temperature in a furnace, supplying a carbon source gas to grow an array of CNTs on the substrate, scraping the array of CNTs, dispersing the CNTs into a solvent to obtain a CNT floccule structure, separating the CNT floccule structure from the solvent (e.g., pouring the solvent containing the CNTs through a filter paper in a funnel and filtering out the solvent in the CNT flocculated structure), shaping the CNT floccule structure into a CNT floccule film. The grown CNT film can be obtained by using chemical vapor deposition method to form a CNT film on a substrate.

As discussed above, the membrane 402 is adapted to prevent contaminant particles from landing on a photomask, e.g., photomask 205c (FIG. 2), and degrading the result of photolithography process (e.g., by keeping contaminant particles away from a focus plane of the photomask).

The membrane 402 is transparent to the radiation beam used in a lithography patterning process. In some embodiments, the membrane 402 is transparent to UV light. In some embodiments, the membrane 402 is transparent to EUV light. The thickness of the membrane 402 is set to provide the membrane with sufficient strength to withstand the pressure created by the collisions of contaminant particles with the membrane without degrading the membrane.

In some embodiments, the network of CNT nanotubes is a plurality of CNT nanotubes that are randomly arranged to form a network structure, including both single wall carbon nanotube (SWCNT) and multiwall carbon nanotube (MWCNT). A multiwall nanotube includes an inner tube and one or more outer tubes coaxially disposed around the inner tube. In some embodiments, the outer tube is movable along the axial direction with respect to the inner tube and in other embodiments, the outer tube is fixed on the outer surface of the inner tube. The individual CNT nanotubes 404 are arranged randomly such that the CNT 404 are not arranged along a major or predominant direction.

The CNT 404 may also be bundled such that a plurality of individual nanotubes form a bundle (i.e., a string or rope-like structure). In a nanotube bundle, individual CNT nanotubes 404 may be aligned and joined along their vertical or transversal directions such that the diameter of the nanotube bundle is greater than the diameter of the individual nanotubes. The CNT 404 may typically be joined by van der Waals forces.

The CNT 404 may have various cross-sectional sectional shapes, for example, including but not limited to, a circular cross-sectional shape, an elliptical cross-sectional shape, or a polygonal cross-sectional shape.

Figure 5A:
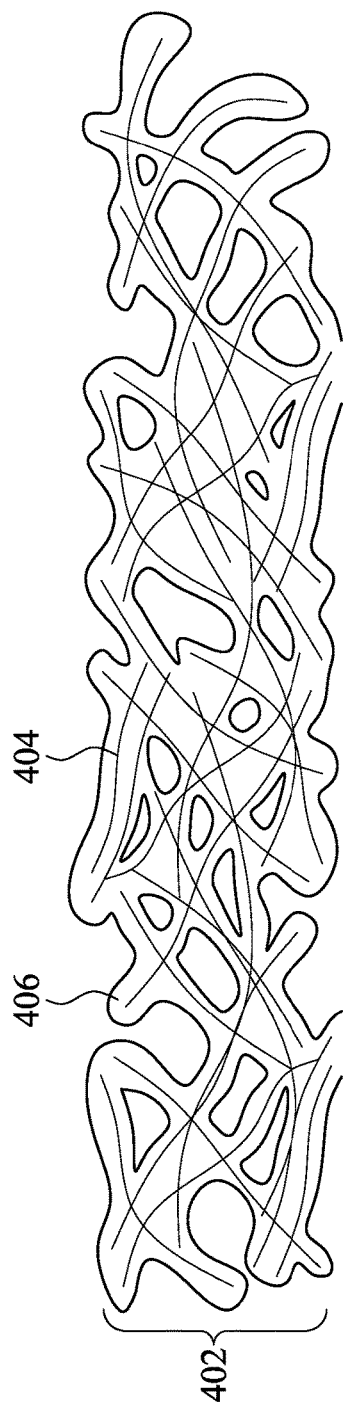
Figure 5B:
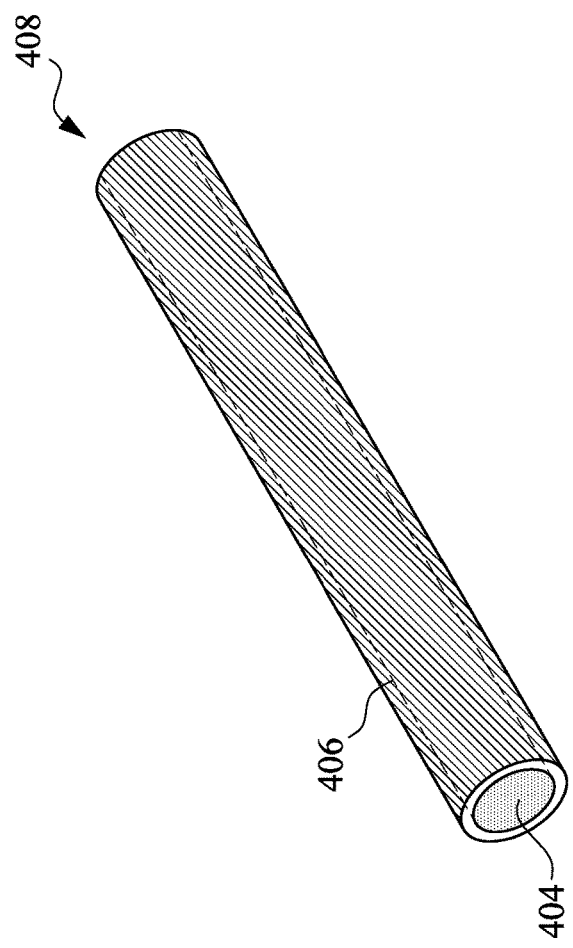
FIG. 5B is a schematic perspective view of a nanotube, in accordance with some embodiments.

FIG. 5A is a cross-sectional view of various stages of forming a pellicle assembly, in accordance with some embodiments. FIG. 5B is a schematic perspective view of a nanotube, in accordance with some embodiments. Referring to FIGS. 3 and 5A-5B, the method 1000 proceeds to operation 1004, in which a protective film is deposited on the membrane, in accordance with some embodiments using atomic layer deposition (ALD). For example, a protective film 406 is deposited on the CNT nanotubes 404.

As shown in FIG. 5B, each of the CNT 404 covered with the protective film 406 are collectively referred to as a core-shell structure 408 including a core nanotube and a shell of a material of the protective film 406. The protective film 406 surrounds the CNT 404 continuously and conformally and includes a material having high resistance to oxidation and chemicals. The protective film 406 thus helps to protect the CNT 404 from the attack by UV or EUV light and ionized gases that come in contact with the protective film 406, e.g., the hydrogen ions/radicals, and hence prolonging the CNT nanotube lifetime. The protective film 406 also serves as a thermal conductive layer which promotes the transfer of the thermal energy from the CNT 404 to the environment around the membrane 402. In some embodiments, the protective film 406 includes a low extinction coefficient material to ensure sufficient transmission of UV or EUV light and a high transmission of the radiation to the photomask. In some embodiments, the protective film 406 includes silicon nitride.

Figure 6A:
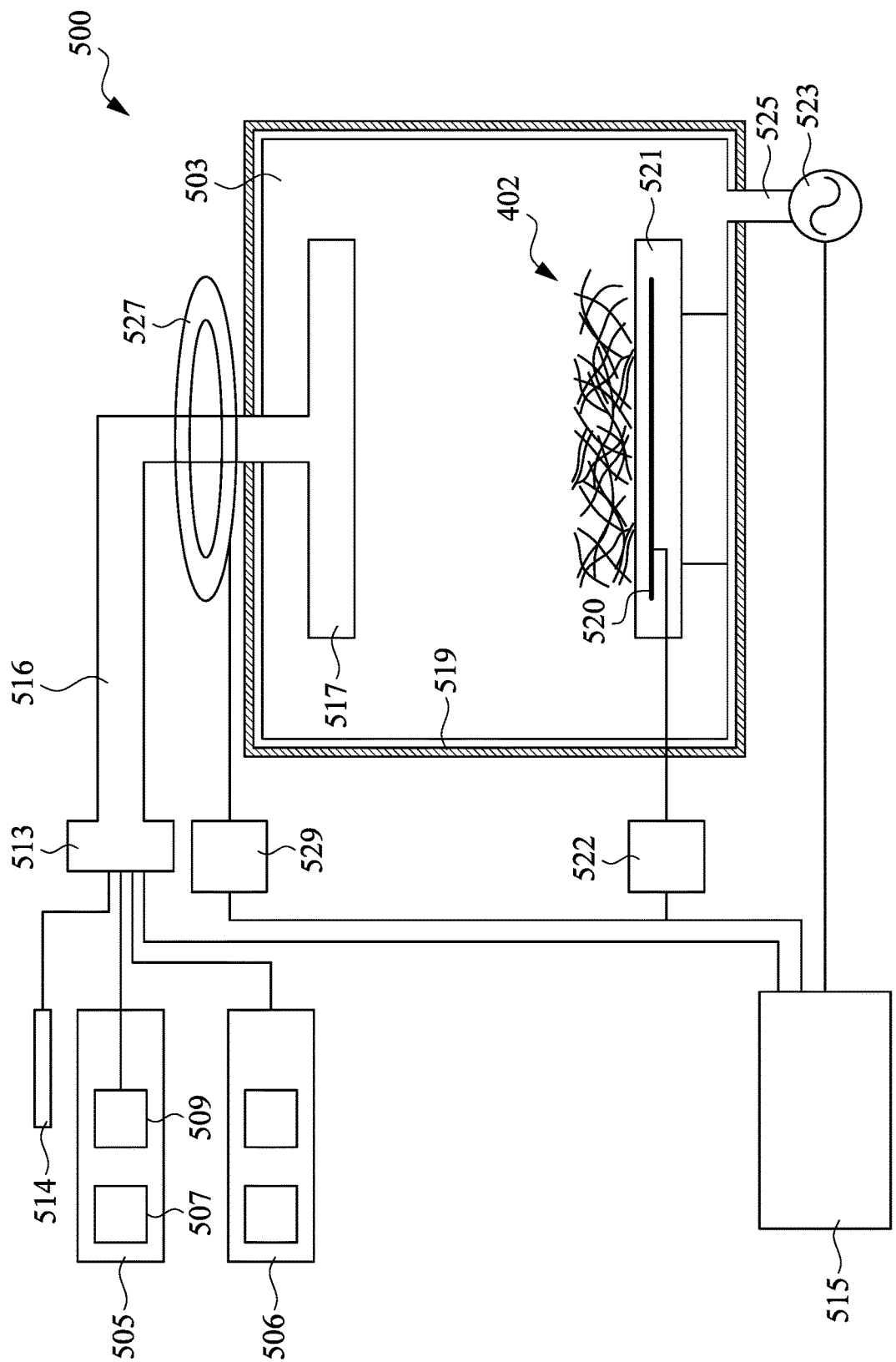
FIG. 6A illustrates a deposition system that may be used to deposit the protective film using plasma enhanced atomic layer deposition (PEALD).

FIG. 6A illustrates a deposition system 500 that may be used to deposit the protective film 406 using plasma enhanced atomic layer deposition (PEALD). In some embodiments, the deposition system may be Capacitively coupled plasma (CCP) processing system, Inductively coupled plasma (ICP), Microwave Induce Plasma (MIP), or Hollow Cathode Plasma (HCP). In an embodiment, the deposition system 500 receives precursor materials from a precursor delivery system 505 and/or reactant materials from a reactant delivery system 506. In an embodiment, the precursor delivery system 505 and the reactant delivery system 506 may work in conjunction with one another to supply the various different precursor materials to a deposition chamber 503 wherein a workpiece, for example, the membrane 402, is placed. In other embodiments, fewer or more precursor delivery systems may be used.

For example, the precursor delivery system 505 and the reactant delivery system 506 may each include a gas supply 507 and a flow controller 509. In an embodiment in which the precursor material is stored in a gaseous state, the gas supply 507 may supply the precursor material to the deposition chamber 503. The gas supply 507 may be a vessel, such as a gas storage tank, that is located either locally to the deposition chamber 503 or else may be located remotely from the deposition chamber 503. Alternatively, the gas supply 507 may be a facility that independently prepares and delivers the precursor material to the flow controller 509. Any suitable source for the precursor material may be utilized as the gas supply 507, and all such sources are fully intended to be included within the scope of the embodiments.

The gas supply 507 may supply the desired precursor to the flow controller 509. The flow controller 209 may be used to control the flow of the precursor to the gas controller 513 and, eventually, to the deposition chamber 503, thereby also helping to control the pressure within the deposition chamber 503. The flow controller 509 may be, e.g., a proportional valve, a modulating valve, a needle valve, a pressure regulator, a mass flow controller, combinations of these, or the like. However, any suitable method for controlling and regulating the flow of the precursor materials may be used, and all such components and methods are fully intended to be included within the scope of the embodiments.

However, as one of ordinary skill in the art will recognize, while the precursor delivery system 505 and the reactant delivery system 506 have been described herein as having identical components, this is merely an illustrative example and is not intended to limit the embodiments in any fashion. Any type of suitable precursor delivery system, with any type and number of individual components identical to or different from any of the other precursor delivery systems within the deposition system 500, may alternatively be utilized. All such precursor systems are fully intended to be included within the scope of the embodiments.

The precursor delivery system 505 and the reactant delivery system 506 may supply their individual materials into the gas controller 513. The gas controller 513 connects and isolates the precursor delivery system 505 and the reactant delivery system 506 from the deposition chamber 503 in order to deliver the desired materials to the deposition chamber 503. The gas controller 513 may include such devices as valves, flow meters, sensors, and the like to control the delivery rates of each of the precursors, and may be controlled by instructions received from the control unit 515. In some embodiments a purge gas delivery system 514 may be connected to the gas controller 513 and provide a purge gas to the deposition chamber 503. The purge gas delivery system 514 may include a gaseous tank or other facility that provides a purge gas such as nitrogen ($N_2$), helium (He), argon (Ar), xenon (Xe), or combinations of these, or the like, although other suitable purge gases may alternatively be used.

The gas controller 513, upon receiving instructions from the control unit 515, may open and close valves so as to connect one or more of the precursor delivery system 505 or the reactant delivery system 506 to the deposition chamber 503 and direct a desired material through a manifold 516, used the deposition chamber 503, and to a showerhead 517. The showerhead 517 may be used to disperse the chosen materials into the deposition chamber 503 and may be designed to evenly disperse the materials in order to minimize undesired process conditions that may arise from uneven dispersal. In an embodiment the showerhead 517 may have a circular design with openings dispersed evenly around the showerhead 517 to allow for the dispersal of the desired materials into the deposition chamber 503.

However, as one of ordinary skill in the art will recognize, the introduction of materials to the deposition chamber 503 through a single showerhead 517 or through a single point of introduction as described above is intended to be illustrative only and is not intended to be limiting to the embodiments. Any number of separate and independent showerheads 517 or other openings to introduce precursor materials into the deposition chamber 503 may alternatively be used. All such combinations of showerheads and other points of introduction are fully intended to be included within the scope of the embodiments.

The deposition chamber 503 may receive the desired materials and expose the materials to the membrane 402. The deposition chamber 503 may be any desired shape that may be suitable for dispersing the materials and contacting the materials with the membrane 402. In the embodiment illustrated in FIG. 6A, the deposition chamber 503 has a cylindrical sidewall and a bottom. However, the deposition chamber 503 is not limited to a cylindrical shape, and any other suitable shape, such as a hollow square tube, an octagonal shape, or the like, may be used. Furthermore, the deposition chamber 503 may be surrounded by a housing 519 made of material that is inert to the various process materials. As such, while the housing 519 may be any suitable material that can withstand the chemistries and pressures involved in the deposition process, in an embodiment the housing 519 may be steel, stainless steel, nickel, aluminum, alloys of these, combinations of these, and like.

Within the deposition chamber 503 the membrane 402 may be placed on a mounting platform 521 in order to position and control the membrane 402 during the deposition processes. The mounting platform 521 may include heating mechanisms in order to heat the membrane 402 during the deposition processes. Furthermore, while a single mounting platform 521 is illustrated in FIG. 6A, any number of mounting platforms 521 may additionally be included within the deposition chamber 503.

Additionally, the deposition chamber 503 and the mounting platform 521 may be part of a cluster tool system (not shown). The cluster tool system may be used in conjunction with an automated handling system in order to position and place the membrane 402 into the deposition chamber 503 prior to the deposition processes, position, hold the membrane 402 during the deposition process, and remove the membrane 402 from the deposition chamber 503 after the deposition process.

The mounting platform 521 may additionally include a first electrode 520 coupled to a first RF generator 522. The first electrode 520 may be electrically biased by the first RF generator 522 (under control of the control unit 515) at a RF voltage during the deposition process. By being electrically biased, the first electrode 520 is used to provide a bias to the incoming gaseous material (e.g., precursor gases, reactants, purge gases, etc.) and assist to ignite them into a plasma during a step of the deposition process. Additionally, the first electrode 520 is also used to maintain the plasma during the deposition process by maintaining the bias.

The deposition chamber 503 also includes an upper electrode 527, for use as a plasma generator. In some embodiments, the plasma generator may be a transformer coupled plasma generator and may be, e.g., a coil. The coil may be attached to a second RF generator 529 that is used to provide power to the upper electrode 527 (under control of the control unit 515) in order to ignite the plasma during introduction of the gaseous material. However, while the upper electrode 527 is described above as a transformer coupled plasma generator, embodiments are not intended to be limited to a transformer coupled plasma generator. Rather, any suitable method of generating the plasma, such as capacitively coupled plasma (CCP), inductively coupled plasma (ICP), microwave induce plasma (MIP), hollow cathode plasma (HCP), or the like, may alternatively be used. All such methods are fully intended to be included within the scope of the embodiments.

The deposition chamber 503 may also have an exhaust outlet 525 for exhaust gases to exit the deposition chamber 503. A vacuum pump 523 may be connected to the exhaust outlet 525 of the deposition chamber 503 in order to help evacuate the exhaust gases. The vacuum pump 523, under control of the control unit 515, may also be utilized to reduce and control the pressure within the deposition chamber 503 to a desired pressure and may also be used to evacuate precursor materials, reactant materials, or reaction byproducts from the deposition chamber 503 in preparation for another step of the deposition process.

The control unit 515 is configured to control operation of one or more components of the deposition system 500, so as to cause the deposition system 500 to perform a PEALD process that forms a deposited layer on a workpiece (e.g., the membrane 402). The control unit 515 is configured to sequentially control the flow of the reactant gas, the precursor gas, and the purge gas, as well as the operation of the first and second RF generators 522, 529.

It will be appreciated that the precursor gas and the reactant gas for forming the protective film 406 may be chosen based upon a material to be deposited. In various embodiments, the deposited protective film 406 may include silicon nitride. To form deposited layer comprising a silicon nitride, a silicon-based precursor and a reactant gas may be used. For example, the silicon-based precursor may include Tris(dimethylamido)silane (3DMASi), Tetrakis(dimethylamido)silane (TDMASi), Bis(diethylamino)silane (BDEAS), bis(tert-butylamido)silane (BTBAS), bis(dimethylamido)silane (BDMAS), bis(ethylmethylamino)silane (BEMAS), Diaminosilane ($SiH_2(NH_2)_2$), Silane ($SiH_4$), Disilane ($Si_2H_6$), Dimethyldichlorosilane (DMDCS), Monochlorosilane (MCS), Dichlorosilane (DCS), Hexachlorodisilane ($Si_2Cl_6$), Di(isopropylamino)silane (DIPAS), Di(sec-butylamino)silane (DSBAS), Tetrakis(ethylamido)silane (TEASi), TetraethylorthoSilicate (TEOS), Tris (isopropyl)aminosilane (TIPAS), Trimethylsilane (TMS), Triisopropylsilane (TIPS), Tris(dimethylamino)chlorosilane (3DMASiCl), Tris(ethylmethylamido)silane (3EMAS), or Trisilylamine ($N(SiH_3)_3$). The reactant gas includes Argon (Ar), nitrogen ($N_2$), ammonia ($NH_3$), $N_2O$, $NO_2$, hydrogen ($H_2$) or a mixture thereof.

In some embodiments, within the deposition chamber 503 the protective film 406 may be deposited under a pressure from about $10^{-3}$ Torr to about $10^2$ Torr, a power of about 50 W to about 600 W, and at a temperature in a range from about 100° C. to about 500° C.

In a particular embodiment, the deposition process for forming the protective film 406 may be a plasma-enhanced atomic layer deposition (PEALD) process including a number of repeated deposition cycles, in which each cycle includes a number of steps in a range from 40 cycles to 100 cycles, such as 50 cycles or 80 cycles. For example, a deposition cycle may include a first plasma exposure step, a silicon-based precursor dosing step, and a second plasma exposure step.

Figure 6B:
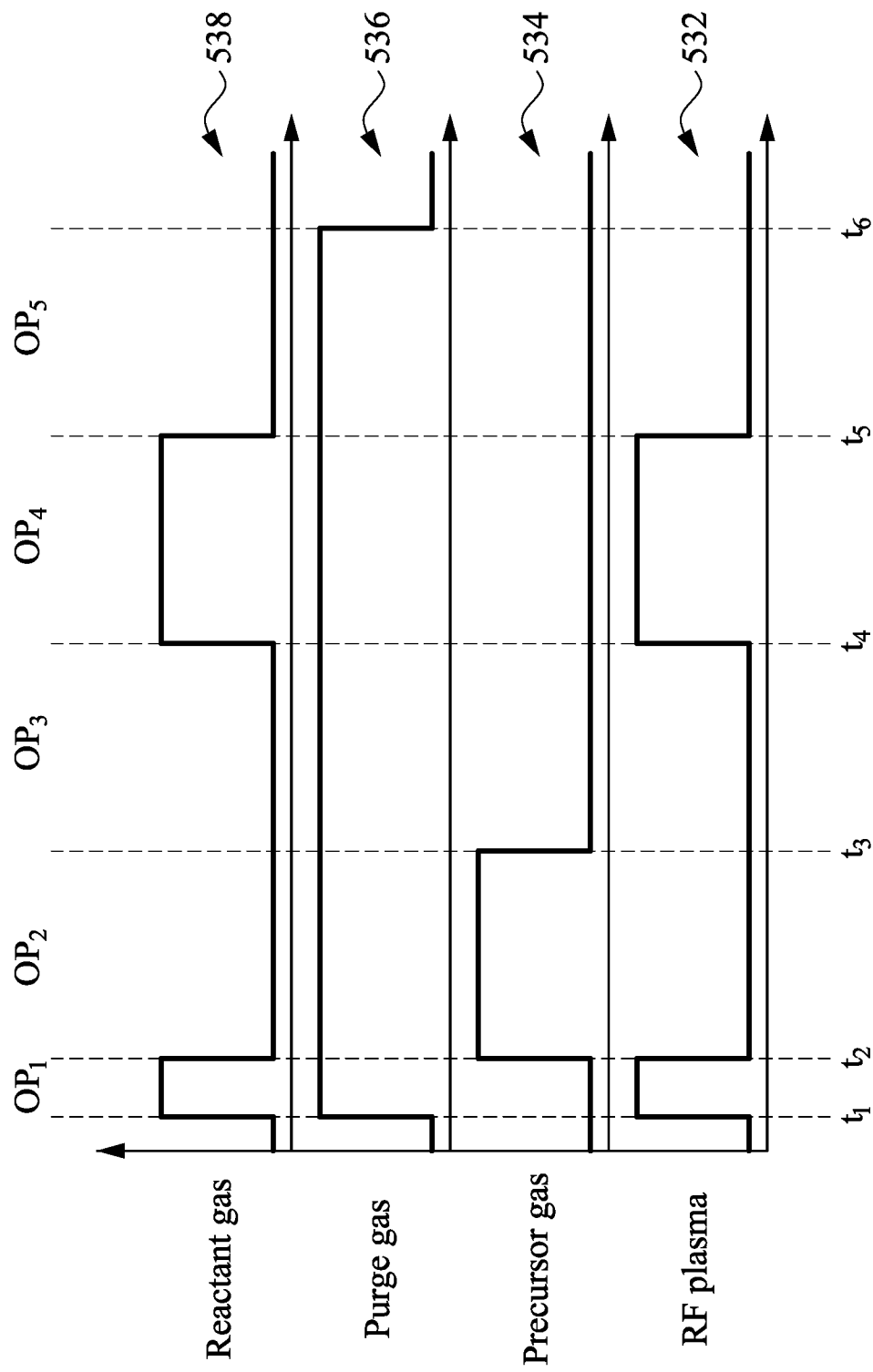
FIGS. 6B and 6C show timing diagrams illustrating an exemplary operation of the PEALD system by a control unit.

FIG. 6B shows timing diagrams 532, 534, 536, and 538 illustrating an exemplary operation of the deposition system 500 by the control unit 515. As shown in the timing diagram 538, at a first time $t_1$ the control unit 515 operates to introduce a reactant gas into the deposition chamber 503 by way of the reactant gas conduit. The control unit 515 causes the reactant gas to flow into the deposition chamber 503 from the first time $t_1$ to a second time $t_2$. As shown in the timing diagram 536, the control unit 515 operates the purge gas delivery system 514 to introduce a purge gas into the deposition chamber 503 by way of a purge gas conduit. The purge gas flow continuously in each of the deposition cycle. The purged gas is simultaneously introduced into the deposition chamber 503 with introducing the reactant gas into the deposition chamber 503. The continuously flowing purge gas may be provided at a constant flow rate or at varied but controlled flow rate. When the reactant gas and the purge gas are employed and the flow of the purge gas is continuous, two of them will co-exist in the gas phase during a portion of the deposition cycle (e.g., during a first operating period ($OP_1$) and during a fourth operating period ($OP_4$)).

During the first operating period ($OP_1$), present between the first time $t_1$ and the second time $t_2$, a first plasma exposure step is performed. For example, the control unit 515 further operates the upper electrode 527 to ionize the reactant gas to generate a plasma comprising a plurality of ionized reactant molecules within the deposition chamber 503 (as shown in timing diagram 532). In particular, the plasma can help increase a dose of ionized silicon-based precursor molecules (see FIG. 7B) of a subsequent silicon-based precursor. During the first operating period ($OP_1$), Sp2 hybrid orbital of carbon atoms of the CNT 404 can be converted to sp3 hybrid orbital, which is able to form a covalent bond with an incoming atom or molecule (e.g., the silicon-based precursor gas), due to the plasma. In other words, the carbon atoms of the CNT 404 have a sp2 hybrid orbital to sp3 hybrid orbital conversion. As a result, an additional pre-treatment to convert the sp2 hybrid orbital of the carbon atoms of the CNT 404 is not required. In some other embodiments, an additional ammonia treatment is performed to convert the sp2 hybrid orbital of the carbon atoms of the CNT 404 to sp3 hybrid orbital in a duration in a range from 1 minutes to 10 minutes, such as 2 minutes.

Figure 7A:
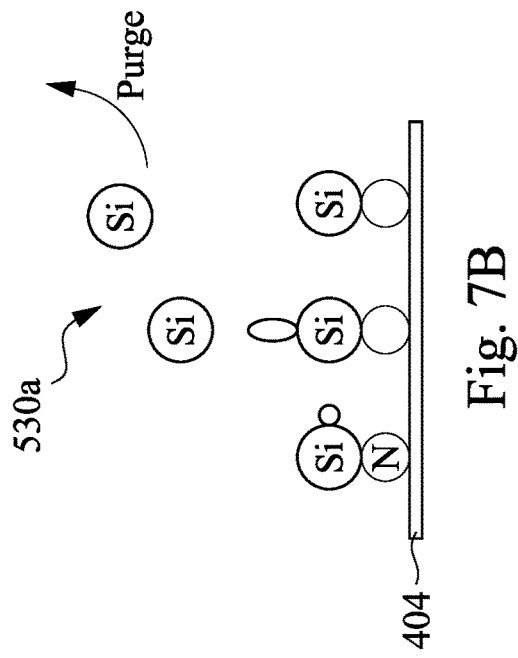
FIGS. 7A-7D illustrate the synthesis of protective film using a plasma enhanced atomic layer deposition (PEALD) via alternating exposures to precursor and reactant gas.

At a second operating time $t_2$ ($OP_2$), present between the second time $t_2$ and a third time $t_3$, a silicon-based precursor dosing step is performed. For example, the control unit 515 turns off the reactant gas and operates the silicon-based precursor to introduce the silicon-based precursor into the deposition chamber 503 by way of a precursor gas conduit. FIG. 7A is a schematic cross-sectional view of the CNT 404 after the second operating time $t_2$. As discussed previously, the plasma at the first operation time ($OP_1$) allows formation of ionized silicon-based precursor molecules 530, which can bond with a subsequent reactant. The precursor gas and the purge gas co-exist in the gas phase during the second operating period ($OP_2$).

Figure 6C:
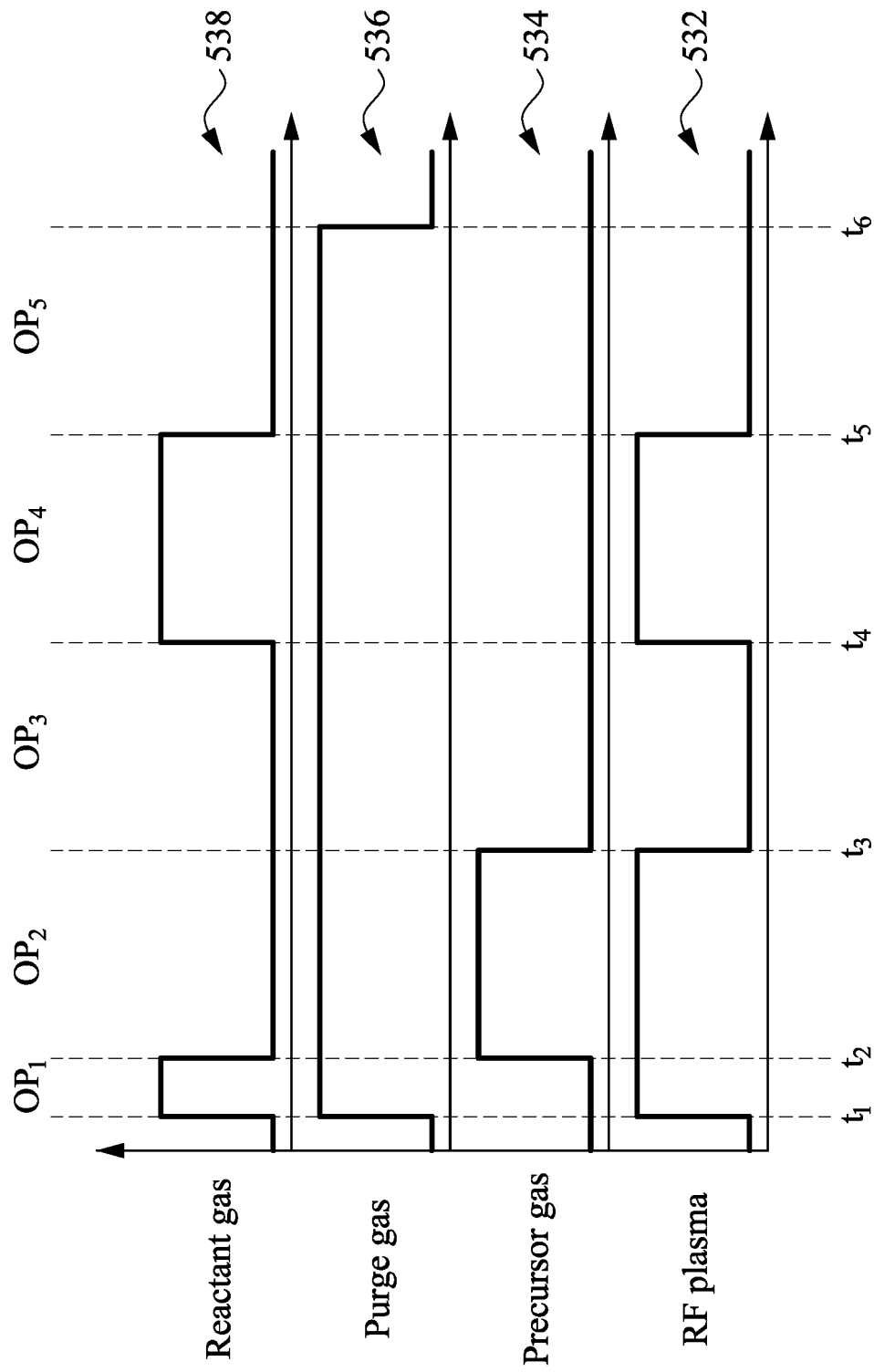

In some other embodiments, the plasma spans the first operation time ($OP_1$) and the second operation time ($OP_2$) (see FIG. 6C). During the second operating period ($OP_2$), the control unit 515 continues operating the upper electrode 527 to maintain the plasma (e.g., an RF plasma) from the silicon-based precursor gas. In this case, the dose of the ionized reactant molecules within the deposition chamber 503 can be increased.

Figure 7B:
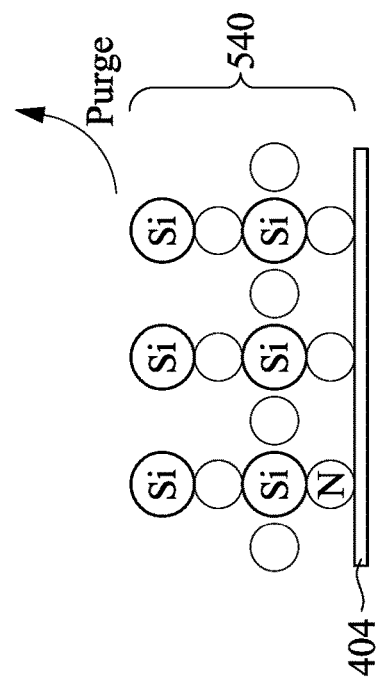

At a third operating time $t_3$ ($OP_3$), present between the third time $t_3$ and a fourth time $t_4$, the control unit 515 turns off the silicon-based precursor gas and continues operating the purge gas delivery system 514 to continue introducing the purge gas that purges some of the ionized silicon-based precursor molecules 530 from the deposition chamber 503, as shown in the timing diagram 534. The third operating time ($OP_3$) is reduced such that a residue of the ionized silicon-based precursor molecules 530a stay in the deposition chamber 503, as shown in FIG. 7B. FIG. 7B is a schematic cross-sectional view of the CNT 404 after the third time $t_3$. As can be seen from FIG. 7B, a layer of reactant molecules and silicon-based precursor gas is uniformly absorbed on the surface of the CNT 404, thus forming a uniform N/Si arrangement.

Figure 7C:
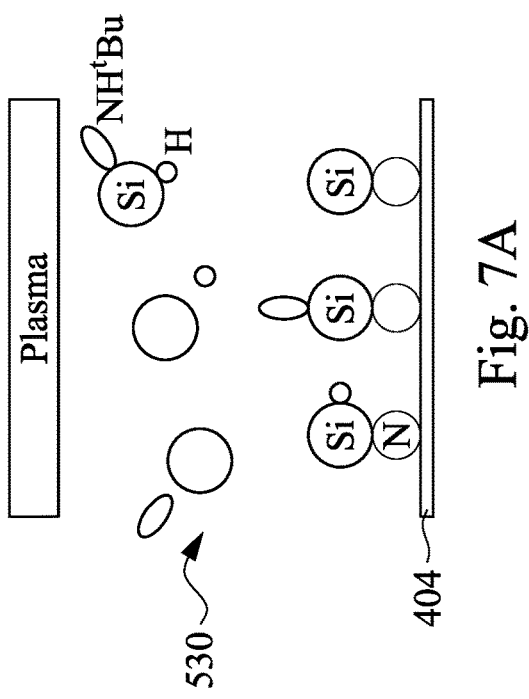

During a fourth operating period ($OP_4$), present between a fourth time $t_4$ and a fifth time $t_5$, a second plasma exposure step is performed. For example, the control unit 515 operates to introduce a reactant gas into the deposition chamber 503 by way of the reactant gas conduit, as shown in timing diagram 538. The control unit 515 causes the reactant gas to flow into the deposition chamber 503 from the third time $t_4$ to the fourth time $t_5$. FIG. 7C is a schematic cross-sectional view of the CNT 404 after the fifth time $t_5$.

During the fourth operating period ($OP_4$), the control unit 515 further operates the upper electrode 527 to ignite a plasma (e.g., an RF plasma) from the reactant gas, as shown in timing diagram 532. The plasma causes the reactant gas to interact with the deposited silicon-based precursor gas molecules that had accumulated on the CNT 404. Since the residue of the ionized silicon-based precursor molecules 530a (see FIG. 7B) is present in the deposition chamber 503 as well, the ionized silicon-based precursor molecules can then be accumulated on the CNT 404, resulting in an increased growth per cycle (GPC). For example, each cycle of the PEALD has the GPC of more than one atomic layer thickness (see FIG. 7D).

Figure 7D:
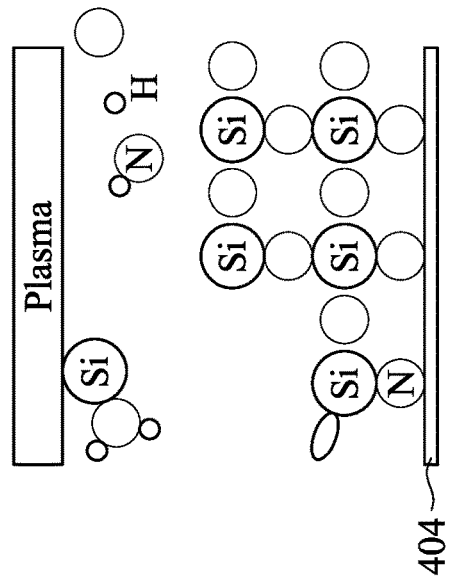

At the fifth time $t_5$ (during a fifth operating period ($OP_5$)), the control unit 515 turns off the reactant gas and continues operating the purge gas delivery system 514 to continue introducing the purge gas that purges the residue of the reactant gas from the deposition chamber 503 as shown in timing diagram 536. FIG. 7D is a schematic cross-sectional view of the CNT 404 after the sixth time $t_6$. As can be seen from FIG. 7D, a layer of reactant molecules is uniformly absorbed on the surface of the CNT 404, thus forming a uniform N/Si/N/Si arrangement 540. The thickness of the N/Si/N/Si arrangement 540 refers to as the growth per cycle (GPC). Each complete ALD cycle of the present disclosure may include the sequence of the timing diagrams 532, 534, 536, and 538 (see FIGS. 6B-6C). The ALD cycle may be fully executed and repeated until a film of the desired thickness is obtained. In some embodiments where the PEALD process to form the protective film 406 includes about 50 cycles, the protective film 406 has a thickness in a range from 1.95 nm to 2.05 nm, such as 2 nm. In some embodiments where the PEALD process to form the protective film 406 includes about 80 cycles, the protective film 406 has a thickness in a range from 2.45 nm to 2.55 nm, such as 2.5 nm.

Referring back to FIGS. 5A-5B, during the deposition, the mounting platform may be rotated or titled to ensure conformal and uniform deposition of the protective film 406 onto the CNT 404. In some embodiments where the protective film 406 includes silicon nitride, by using the PEALD process to form the protective film 406, the Si/N atomic ratio of the protective film 406 can be substantially equal to 1. In some embodiments where the PEALD process to form the protective film includes about 50 cycles, the protective film 406 has a silicon atomic ratio in a range from 11% to 14%, such as 12.5%, and a nitrogen atomic ratio in a range from 12% to 15%, such as 13.9%. In some embodiments where the PEALD process to form the protective film includes about 80 cycles, the protective film 406 has a silicon atomic ratio in a range from 18% to 21%, such as 19.8%, and a nitrogen atomic ratio in a range from 20% to 23%, such as 21.4%. In some embodiments, oxidation of the protective film 406 cannot be avoided such that the protective film 406 have some oxygen atoms therein and has an oxygen atomic ratio in a range from 18% to 20%, such as 19.3%, or in a range from 23% to 25%, such as 24.1%.

Figure 8:
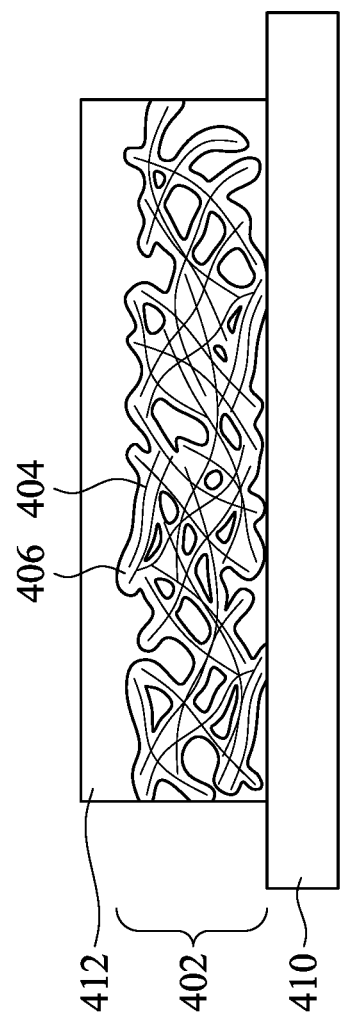

Referring to FIG. 3 and FIG. 8, the method 1000 includes operation 1006, in which a pellicle membrane including the membrane is formed over a filter membrane 410, in accordance with some embodiments. FIG. 8 is a cross-sectional view of a pellicle assembly after forming a pellicle membrane 412 over the filter membrane 410, in accordance with some embodiments.

The filter membrane 410 is a porous membrane. In some embodiments, the filter membrane 410 is formed of or coated with polyethylene terephthalate (PET). In some embodiments, the filter membrane 410 is formed of or coated with other suitable materials such as nylon, cellulous, polymethylmethacrylate (PMMA), polystyrene (PS), polytetrafluoroethylene (PTFE), or polybenzoxazole (PBO). In some embodiments, the filter membrane 410 is formed of a cellulose-based filter paper. In some embodiments, the filter membrane 410 is a hydrophilic membrane. In some other embodiments, the filter membrane 410 is a hydrophobic membrane.

In some embodiments, the pellicle membrane 412 may be formed by first forming a suspension of c in a liquid medium. In some embodiments, the suspension is formed by adding CNT 404 into the liquid medium under mixing conditions. The mixture is then sonicated to ensure the CNT 404 is well dispersed in the liquid medium. The liquid medium is a non-solvent liquid medium that is non-reactive with the CNT 404 and in which the CNT 404 are virtually insoluble. The liquid medium also has a low boiling point so that the liquid medium can be easily and quickly removed, facilitating drying of the continuous nanotube network subsequently formed. Examples of suitable non-solvent liquid medium that can be used to make the nanotube suspension include, but are not limited to, water, volatile organic liquids such as acetone, ethanol, methanol, n-hexane, ether, acetonitrile, chloroform, DMF, and mixtures thereof. In some embodiments, the suspension is formed by dispersing CNT 404 into water.

In some embodiments, the suspension may also include a surfactant to maintain the suspension and/or other chemical agents to facilitate nanotube network formation or dewatering. For example, Triton X-100 and dodecylbenzenesulfonic acid sodium salt may be used. However, sometimes, a surfactant may not be needed if the CNT 404 can form a stable suspension in the liquid medium without it.

Next, the suspension of CNT 404 is applied to the surface of the filter membrane 410, for example, by spin coating or dip coating. The suspension is filtered by the filter membrane 410 to remove the liquid medium, leaving a layer of continuous CNT 404 on the filter membrane 410. The layer of continuous CNT 404 constitutes a single layer of pellicle membrane 412. In some embodiment, the filtration step is conducted with the aid of vacuum to pull the liquid medium through the filter membrane 410. The amount of vacuum used depends on factors such as the porosity of the filter membrane 410, the viscosity of the liquid medium, speed of movement of the filter membrane 410, and the concentration of CNT 404 in the suspension. All of these parameters can be manipulated to achieve the desired characteristics of the nanotube network, including the thickness and porosity of the continuous network. The as-deposited CNT 404 may subsequently be cleaned using a cleaning solvent to remove any contaminants thereon. Suitable cleaning solvents includes, but are not limited to, water and alcohol such as ethanol.

Figure 9:
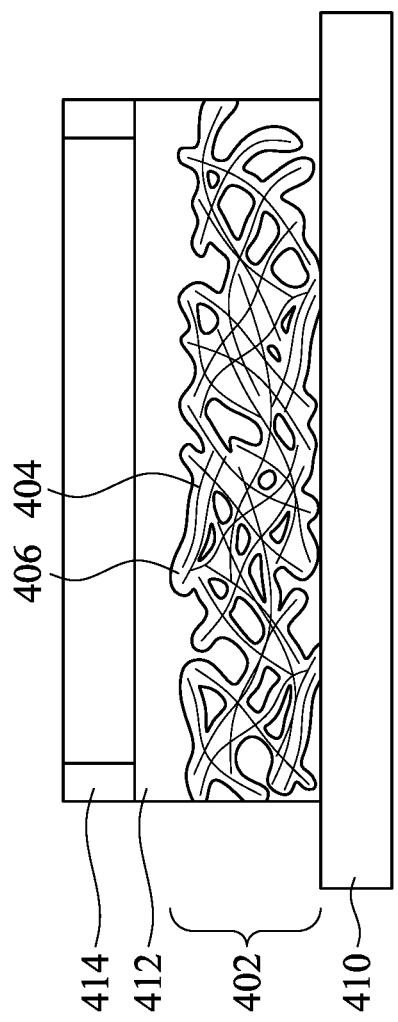

Referring to FIGS. 3 and 9, the method 1000 proceeds to operation 1008, in which a pellicle border 414 is attached to the pellicle membrane 412, in accordance with some embodiments. FIG. 9 is a cross-sectional view of the pellicle of FIG. 8 after attaching the pellicle border 414 to the pellicle membrane 412, in accordance with some embodiments. Although the method 1000 illustrated and described herein includes the pellicle border 414 being attached to the pellicle membrane 412 after the protective film 406 is deposited on the CNT nanotubes 404, in other embodiments, the pellicle border 414 may be attached to the pellicle member 412 before depositing the protective film 406 on the CNT nanotubes 404.

Referring to FIG. 9, the pellicle border 414 is attached along a peripheral portion of the pellicle membrane 412. In some embodiments, the pellicle border 414 is made of silicon, silicon carbide, silicon nitride, silicon dioxide, silicon oxynitride, $Al_2O_3$, Ti, or combinations thereof. To attach the pellicle border 414 to the pellicle membrane 412, in some embodiments, the pellicle border 414 is first brought into physical contact with the pellicle membrane 412. The pellicle border 414 is then pressed against the pellicle membrane 412 to fix the pellicle border 414 to the pellicle membrane 412 given that a sufficient force is used. In some embodiments, the pellicle border 414 and the pellicle membrane 412 are held together by van der Waals forces. In some embodiments, to ensure a better adhesion, an adhesive (not shown) is used to the pellicle border 414 to the pellicle membrane 412. The adhesive needs to be low outgassing to avoid material deposition on mask surface.

Referring to FIGS. 3 and 10, the method 1000 proceeds to operation 1010, in which the filter membrane 410 is removed from the pellicle membrane 412, in accordance with some embodiments. FIG. 10 is a cross-sectional view of the pellicle of FIG. 9 after removing the filter membrane 410 from the pellicle membrane 412, in accordance with some embodiments.

Referring to FIG. 10, the assembly of the pellicle membrane 412 and the filter membrane 410 shown in FIG. 10 is flipped upside down so that the filter membrane 410 is positioned on top of the pellicle membrane 412. Subsequently, the filter membrane 410 is removed from the pellicle membrane 412. In some embodiments, the filter membrane 410 may be removed by peeling or pulling the filter membrane 410 away from the pellicle membrane 412. As shown in FIG. 10, after removal of the filter membrane 410, the pellicle membrane 412 is supported by the pellicle border 414 along the peripheral portion of the pellicle membrane 412.

Referring to FIGS. 3 and 11, the method 1000 proceeds to operation 1012, in which an assembly of the pellicle membrane 412 and the pellicle border 414 is attached to a pellicle frame 416, in accordance with some embodiments. FIG. 11 is a cross-sectional view of the structure of FIG. 10 after attaching the assembly of the pellicle membrane 412 and the pellicle border 414 to the pellicle frame 416, in accordance with some embodiments.

Referring to FIG. 11, the pellicle frame 416 is configured to properly secure the pellicle membrane 412 to the photomask 205c (FIG. 12). The pellicle frame 416 may be designed in various dimensions, shapes, and configurations. In some embodiments, the pellicle frame 230 may have a round shape, a rectangular shape, or any other suitable shape.

The pellicle frame 416 may include a rigid material with a sufficient mechanical strength, and designed in a shape, dimension, and a configuration so as to secure the pellicle membrane 412 properly across the pellicle frame 416. In some embodiments, the pellicle frame 416 may include a porous material. Exemplary materials that can be used in the pellicle frame 416 include, but are not limited to, anodized alumina formed using aluminum (Al), Al-alloy, titanium (Ti), nickel (Ni), gold (Au), silver (Ag), copper (Cu), molybdenum (Mo), platinum (Pt), chromium (Cr), manganese (Mn), iron (Fe), cobalt (Co), palladium (Pd), tantalum (Ta), tungsten (W), silicon, polymer, other suitable material, and/or combinations thereof. In some embodiments, the pellicle frame 416 may include a frame material with a coefficient of thermal expansion (CTE) determined according to the design specifications. In some embodiments, the pellicle frame 416 is formed of an Al—Ti alloy.

In some embodiments, the pellicle frame 416 may include a plurality of vent holes 418. The vent holes 418 are formed to accommodate air pressure equivalent. Because the pellicle membrane 412 is formed of a porous thin film (e.g., the CNT 404) which can help to achieve the air pressure equivalent, in some embodiments, the vent holes 418 in the pellicle frames 416 are not needed.

The assembly of the pellicle membrane 412 and the pellicle border 414 is attached to the pellicle frame 416 via the pellicle border 414 so that the pellicle membrane 412 is stretched over the pellicle frame 416. In some embodiments, the pellicle border 414 is attached to the pellicle frame 416 by a frame adhesive 420. In some embodiments, the frame adhesive 420 includes a thermosetting adhesive material such as, for example, epoxy resin, acrylic resin, fluorine resin, benzocyclobutene (BCB), methylsilsesquioxane (MSQ), polyimide, other thermosetting materials, and/or combinations thereof. In some embodiments, the frame adhesive 420 includes a glue or another material configured to secure pellicle border 414 to pellicle frame 416.

A pellicle 400 is thus formed. The pellicle 400 includes the pellicle frame 416 and the pellicle membrane 412 attached to the pellicle frame 416 via the pellicle border 414. The pellicle 400 helps to prevent the particles from reaching the photomask 205c (FIG. 12) and interfering with the pattern transfer.

Referring to FIGS. 3 and 12, the method 1000 proceeds to operation 1014, in which the pellicle 240 is attached to a photomask 250, in accordance with some embodiments. FIG. 12 is a cross-sectional view of the structure of FIG. 11 after attaching the pellicle 240 to the photomask 205c, in accordance with some embodiments.

Referring to FIG. 12, the pellicle 400 is mounted onto a border region 224b of the photomask 205c in which the border region 224b can be referred to as a peripheral region. In some embodiments, the pellicle frame 416 is attached to a border region 224b at a front side surface 224f of the photomask 205c using a pellicle adhesive 422. The pellicle adhesive 422 may include a material the same as, or different from, the frame adhesive 420. For example, in some embodiments, the pellicle adhesive 422 may include a thermosetting adhesive material such as, for example, epoxy resin, acrylic resin, fluorine resin, BCB, MSQ, or polyimide. In some other embodiments, the pellicle frame 230 may be secured to the photomask 205c in a manner other than the pellicle adhesive 422, such as at least one suction cup, a vacuum, or an electrostatic sticker. In such embodiments, the pellicle adhesive 422 is omitted.

The photomask 205c includes a pattern region 224p usable to transfer patterns onto a semiconductor wafer by photolithography. The pellicle 400 extends over the pattern region 224p of the photomask 205c to protect the pattern region 224p from contaminant particles. Particles unintentionally deposited on the pattern region 224p introduce defects and result in degradation of the transferred patterns. Particles may be introduced by any of a variety of ways, such as during, a cleaning process, and/or during handling of the photomask 205c. By keeping the contaminant particles out of the focal plane of the photomask 205c, a high fidelity pattern transfer from the pattern region 224p to the semiconductor wafer can be achieved.

Figure 13A:
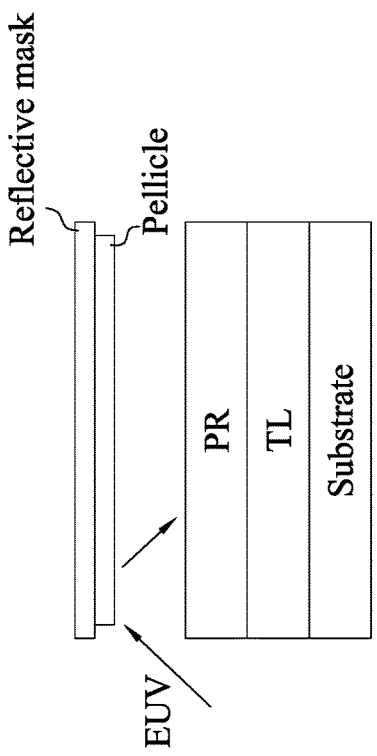
FIG. 13A shows a flowchart of a method of making a semiconductor device.
Figure 13B:
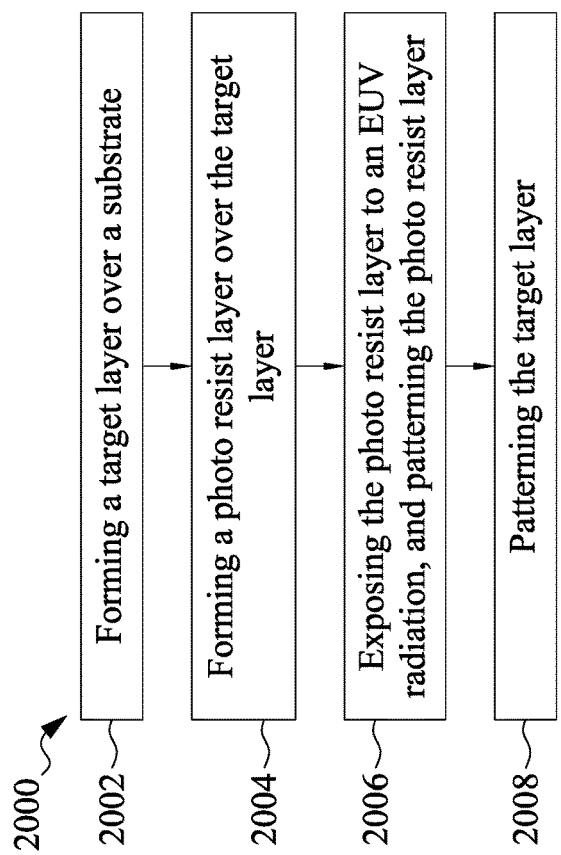
FIGS. 13B, 13C, 13D and 13E show a sequential manufacturing operation of the method of making a semiconductor device in accordance with embodiments of present disclosure.
Figure 13C:
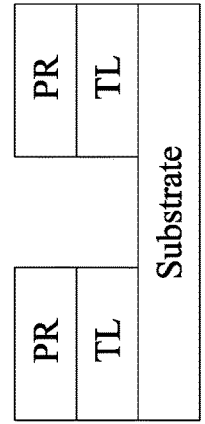

FIG. 13A shows a flowchart of a method 2000 of making a semiconductor device, and FIGS. 13B, 13C, 13D and 13E show a sequential manufacturing operation of the method of making a semiconductor device in accordance with embodiments of present disclosure. A semiconductor substrate or other suitable substrate to be patterned to form an integrated circuit thereon is provided. In some embodiments, the semiconductor substrate includes silicon. Alternatively or additionally, the semiconductor substrate includes germanium, silicon germanium or other suitable semiconductor material, such as a Group III-V semiconductor material. At operation 2002 of FIG. 13A, a target layer to be patterned is formed over the semiconductor substrate. As shown in FIG. 13B, in certain embodiments, the target layer is the semiconductor substrate. In some embodiments, the target layer includes a conductive layer, such as a metallic layer or a polysilicon layer; a dielectric layer, such as silicon oxide, silicon nitride, SiON, SiOC, SiOCN, SiCN, hafnium oxide, or aluminum oxide; or a semiconductor layer, such as an epitaxially formed semiconductor layer. In some embodiments, the target layer is formed over an underlying structure, such as isolation structures, transistors or wirings. At operation 2004, of FIG. 13A, a photo resist layer is formed over the target layer, as shown in FIG. 13B. The photo resist layer is sensitive to the radiation from the exposing source during a subsequent photolithography exposing process. In the present embodiment, the photo resist layer is sensitive to EUV light used in the photolithography exposing process. The photo resist layer may be formed over the target layer by spin-on coating or other suitable technique. The coated photo resist layer may be further baked to drive out solvent in the photo resist layer. At operation 2006 of FIG. 13A, the photo resist layer is patterned using an EUV reflective mask with a pellicle as set forth above, as shown in FIG. 13C. For example, the EUV reflective mask having the pellicle mounted thereupon is loaded into a lithography system, and the substrate is loaded on a substrate stage of the lithograph system. The patterning of the photo resist layer includes performing a photolithography exposing process by an EUV exposing system using the EUV mask. During the exposing process, the integrated circuit (IC) design pattern defined on the EUV mask is imaged to the photo resist layer to form a latent pattern thereon. The patterning of the photo resist layer further includes developing the exposed photo resist layer to form a patterned photo resist layer having one or more openings. In one embodiment where the photo resist layer is a positive tone photo resist layer, the exposed portions of the photo resist layer are removed during the developing process. The patterning of the photo resist layer may further include other process steps, such as various baking steps at different stages. For example, a post-exposure-baking (PEB) process may be implemented after the photolithography exposing process and before the developing process.

Figure 13D:
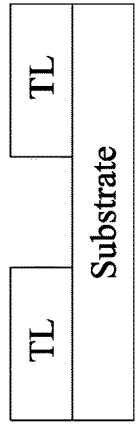
Figure 13E:
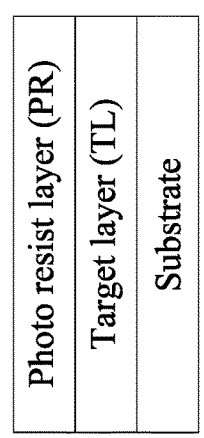

At operation 2008 of FIG. 13A, the target layer is patterned utilizing the patterned photo resist layer as an etching mask, as shown in FIG. 13D. In some embodiments, the patterning the target layer includes applying an etching process to the target layer using the patterned photo resist layer as an etch mask. The portions of the target layer exposed within the openings of the patterned photo resist layer are etched while the remaining portions are protected from etching. Further, the patterned photo resist layer may be removed by wet stripping or plasma ashing, as shown in FIG. 13E.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that, by using the protective film surrounding the carbon nanotube (CNT) to protect the CNT material from hydrogen radicals/ions that are present in the scanner during exposure, the CNT pellicle membrane lifetime can be prolonged. Another advantage is that by generating the plasma at the first operation period prior to introducing the silicon-based precursor into the chamber, the dose of the ionized silicon-based precursor molecules in the chamber at the second operation time can be increased. Yet another advantage is that by reducing the purge time at the third operation time, a residue of the ionized precursor molecules can stay in the chamber, and thus the growth per cycle (GPC) of the protective film can be increased.

In some embodiments, a method of forming a pellicle including forming a protective film surrounding a membrane to form a pellicle membrane using a plasma enhanced atomic layer deposition (PEALD) process, wherein the membrane comprises a network of carbon nanotubes, the PEALD process is performed by a plurality of cycles, and each of the cycles comprises igniting a plasma in a deposition chamber, after igniting the plasma, introducing a silicon-based precursor into the deposition chamber, purging the silicon-based precursor, introducing a reactant gas into the deposition chamber, and purging the reactant gas, placing the pellicle membrane on a filter membrane, transferring the pellicle membrane from the filter membrane to a pellicle border, attaching the pellicle border to a pellicle frame, and mounting the pellicle frame onto a photomask comprising a pattern region. In some embodiments, after purging the silicon-based precursor, a residue of the silicon-based precursor stays in the deposition chamber. In some embodiments, the method further includes introducing the reactant gas into the deposition chamber during igniting the plasma such that the plasma is ignited from the reactant gas. In some embodiments, the protective film comprises a silicon nitride having a Si/N atomic ratio of substantially equal to 1. In some embodiments, the plasma is present during introducing the silicon-based precursor. In some embodiments, the plasma is performed such that carbon atoms of the network of carbon nanotubes of the pellicle membrane have a sp2 hybrid orbital to sp3 hybrid orbital conversion during igniting the plasma in the deposition chamber. In some embodiments, the plasma includes capacitively coupled plasma (CCP), inductively coupled plasma (ICP), microwave induce plasma (MIP), and hollow cathode plasma (HCP). In some embodiments, the plasma is absent during introducing the silicon-based precursor. In some embodiments, each of the cycles has a growth per cycle (GPC) of more than one atomic layer thickness.

In some embodiments, a method for a lithography process includes providing a pellicle including a pellicle membrane, wherein the pellicle membrane includes at least a network of a plurality of carbon nanotubes, at least one of the plurality of carbon nanotubes including a core nanotube and a protective film surrounding the core nanotube, the protective film is silicon nitride having Si/N atomic ratio of substantially equal to 1, mounting the pellicle onto a photomask, wherein the photomask includes a patterned region, loading the photomask having the pellicle mounted thereupon into a lithography system, loading a semiconductor wafer onto a substrate stage of the lithography system, and performing a lithography exposure process to transfer a pattern of the patterned surface from the photomask to the semiconductor wafer. In some embodiments, the protective film is formed using a plasma enhanced atomic layer deposition (PEALD) process. In some embodiments, the PEALD process comprises a plurality of cycles, each of the cycles comprises introducing a reactant gas into a deposition chamber and after introducing the reactant gas, introducing a precursor gas into the deposition chamber. In some embodiments, the reactant gas comprises Argon (Ar), nitrogen ($N_2$), ammonia ($NH_3$), $N_2O$, $NO_2$, hydrogen ($H_2$) or a mixture thereof. In some embodiments, the precursor gas comprises Tris(dimethylamido)silane (3DMASi), Tetrakis(dimethylamido)silane (TDMASi), Bis(diethylamino)silane (BDEAS), bis(tert-butylamido)silane (BTBAS), bis(dimethylamido)silane (BDMAS), bis(ethylmethylamino)silane (BEMAS), Diaminosilane ($SiH_2(NH_2)_2$), Silane ($SiH_4$), Disilane ($Si_2H_6$), Dimethyldichlorosilane (DMDCS), Monochlorosilane (MCS), Dichlorosilane (DCS), Hexachlorodisilane ($Si_2Cl_6$), Di(isopropylamino)silane (DIPAS), Di(sec-butylamino)silane (DSBAS), Tetrakis(ethylamido)silane (TEASi), TetraethylorthoSilicate (TEOS), Tris(isopropyl) aminosilane (TIPAS), Trimethylsilane (TMS), Triisopropylsilane (TIPS), Tris(dimethylamino)chlorosilane (3DMA-SiCl), Tris(ethylmethylamido)silane (3EMAS), or Trisilylamine ($N(SiH_3)_3$). In some embodiments, the method further includes simultaneously introducing a purge gas into the deposition chamber with introducing the reactant gas into the deposition chamber. In some embodiments, one of the plurality of cycles of the PEALD process forms an N/Si/N/Si arrangement. In some embodiments, the method further comprises purging the precursor gas and introducing the reactant gas into the deposition chamber after purging the precursor gas.

In some embodiments, a pellicle includes a pellicle membrane, a pellicle border and a pellicle frame. The pellicle membrane includes a network of a plurality of carbon nanotubes. At least one of the plurality of carbon nanotubes comprises a protective film surrounding the at least one of the plurality of carbon nanotubes. The protective film comprises silicon nitride having a Si/N ratio of substantially equal to 1. The pellicle border is attached to the pellicle membrane along a peripheral region of the pellicle membrane. The pellicle frame is attached to the pellicle border. In some embodiments, the protective film has a silicon atomic ratio in a range from 18% to 21% and a nitrogen atomic ratio in a range from 20% to 23%. In some embodiments, the protective film has a silicon atomic ratio in a range from 11% to 14% and a nitrogen atomic ratio in a range from 12% to 15%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a pellicle, comprising:
    forming a protective film surrounding a membrane to form a pellicle membrane using a plasma enhanced atomic layer deposition (PEALD) process, wherein the membrane comprises a network of carbon nanotubes, the PEALD process is performed by a plurality of cycles, and the cycles start with a step which comprises:
    igniting a plasma in a deposition chamber, wherein igniting the plasma comprises:
    simultaneously introducing a purge gas and a nitrogen-containing reactant gas including nitrogen into the deposition chamber to generate the plasma comprising a plurality of ionized nitrogen-containing reactant within the deposition chamber, the plasma converts sp2 hybrid orbital of carbon atoms of the network of carbon nanotubes to sp3 hybrid orbital, the purge gas comprises: helium (He), argon (Ar), xenon (Xe), or a combination thereof;
    after igniting the plasma, and after simultaneously introducing the purge gas and the nitrogen-containing reactant gas, introducing a silicon-based precursor into the deposition chamber;
    purging the silicon-based precursor;
    introducing the nitrogen-containing reactant gas into the deposition chamber; and
    purging the nitrogen-containing reactant gas;
    placing the pellicle membrane on a filter membrane;
    transferring the pellicle membrane from the filter membrane to a pellicle border;
    attaching the pellicle border to a pellicle frame; and
    mounting the pellicle frame onto a photomask comprising a pattern region.

2. The method of claim 1, wherein after purging the silicon-based precursor, a residue of the silicon-based precursor stays in the deposition chamber.

3. The method of claim 1, further comprising:
    introducing the nitrogen-containing reactant gas into the deposition chamber during igniting the plasma such that the plasma is ignited from the nitrogen-containing reactant gas.

4. The method of claim 1, wherein the plasma is present during introducing the silicon-based precursor.

5. The method of claim 1, wherein the plasma includes capacitively coupled plasma (CCP), inductively coupled plasma (ICP), microwave induce plasma (MIP), and hollow cathode plasma (HCP).

6. The method of claim 1, wherein the plasma is absent during introducing the silicon-based precursor.

7. The method of claim 1, wherein each of the cycles has a growth per cycle (GPC) of more than one atomic layer thickness.

8. The method of claim 1, wherein introducing the silicon-based precursor into the deposition chamber comprises:
    flowing the purge gas simultaneously.

9. The method of claim 1, wherein the nitrogen-containing reactant is nitrogen ($N_2$), ammonia ($NH_3$), $N_2O$, $NO_2$, or a combination thereof.

10. The method of claim 1, wherein simultaneously introducing the purge gas and the nitrogen-containing reactant gas is performed for a first duration, introducing the silicon-based precursor into the deposition chamber is performed for a second duration, and the second duration is greater than the first duration.

11. The method of claim 1, wherein simultaneously introducing the purge gas and the nitrogen-containing reactant gas is performed for a first duration, introducing the nitrogen-containing reactant gas into the deposition chamber is performed for a third duration, the third duration is greater than the first duration.

12. The method of claim 1, wherein the pellicle frame comprises a round shape.

13. The method of claim 1, wherein the pellicle frame comprises a rectangular shape.

14. The method of claim 1, wherein the pellicle frame is Al—Ti alloy.

15. A method for a lithography process, comprising:
    providing a pellicle including a pellicle membrane, wherein the pellicle membrane includes at least a network of a plurality of carbon nanotubes, at least one of the plurality of carbon nanotubes including a core nanotube and a protective film surrounding the core nanotube, the protective film is formed by a deposition process which starts with a step including igniting a plasma, igniting the plasma comprises:
simultaneously introducing a purge gas and a nitrogen-containing reactant gas including nitrogen into a deposition chamber to generate the plasma comprising a plurality of ionized nitrogen-containing reactant within the deposition chamber, the plasma converts sp2 hybrid orbital of carbon atoms of the network of carbon nanotubes to sp3 hybrid orbital, the purge gas comprises: helium (He), argon (Ar), xenon (Xe), or a combination thereof;
after simultaneously introducing the purge gas and the nitrogen-containing reactant gas, introducing a precursor gas into the deposition chamber;
mounting the pellicle onto a photomask, wherein the photomask includes a patterned region;
loading the photomask having the pellicle mounted thereupon into a lithography system;
loading a semiconductor wafer onto a substrate stage of the lithography system; and
performing a lithography exposure process to transfer a pattern of the patterned surface from the photomask to the semiconductor wafer.

16. The method of claim 15, wherein the deposition process is plasma enhanced atomic layer deposition (PEALD) process.

17. The method of claim 15, wherein the precursor gas comprises Tris(dimethylamido) silane (3DMASi), Tetrakis(dimethylamido) silane (TDMASi), Bis(diethylamino) silane (BDEAS), (BTBAS), bis(tert-butylamido) silane bis(dimethylamido) silane (BDMAS), bis(ethylmethylamino) silane (BEMAS), Diaminosilane ($SiH_2$ $(NH_2)_2$), Silane ($SiH_4$), Disilane ($Si_2H_6$), Dimethyldichlorosilane (DMDCS), Monochlorosilane (MCS), Dichlorosilane (DCS), Hexachlorodisilane ($Si_2Cl_6$), Di(isopropylamino) silane (DIPAS), Di(sec-butylamino) silane (DSBAS), Tetrakis(ethylamido) silane (TEASi), TetraethylorthoSilicate (TEOS), Tris(isopropyl)aminosilane (TIPAS), Trimethylsilane (TMS), Triisopropylsilane (TIPS), Tris(dimethylamino) chlorosilane (3DMASiCl), Tris(ethylmethylamido) silane (3EMAS), or Trisilylamine ($N(SiH_3)_3$).

18. The method of claim 15, wherein one of the plurality of cycles of the PEALD process forms an N/Si/N/Si arrangement.

19. The method of claim 15, further comprising:
purging the precursor gas; and
introducing the nitrogen-containing reactant gas into the deposition chamber after purging the precursor gas.

20. The method of claim 15, wherein introducing the precursor gas into the deposition chamber comprises:
generating a plasma from the precursor gas.

* * * * *